United States Patent [19]
Iwasa et al.

[11] Patent Number: 5,798,545
[45] Date of Patent: Aug. 25, 1998

[54] SEMICONDUCTOR STORAGE DEVICE

[75] Inventors: Shoichi Iwasa; Tomofune Tani, both of Tokyo, Japan

[73] Assignee: Nippon Steel Corporation, Tokyo, Japan

[21] Appl. No.: 580,461

[22] Filed: Dec. 27, 1995

[30] Foreign Application Priority Data

| Dec. 28, 1994 | [JP] | Japan | 6-338737 |
| Jan. 13, 1995 | [JP] | Japan | 7-021087 |
| Dec. 20, 1995 | [JP] | Japan | 7-349062 |

[51] Int. Cl.$^6$ .......... H01L 27/108; H01L 29/76; H01L 29/94
[52] U.S. Cl. .......... 257/301; 257/302; 257/304; 257/305; 437/52; 437/60; 365/149
[58] Field of Search .......... 257/301, 302, 257/304, 305; 437/52, 60; 365/149

[56] References Cited

U.S. PATENT DOCUMENTS

| 4,751,558 | 6/1988 | Kenney | 257/302 |
| 4,763,181 | 8/1988 | Tasch, Jr. | 257/302 |
| 5,214,603 | 5/1993 | Dhong et al. | 365/207 |
| 5,512,767 | 4/1996 | Noble, Jr. | 257/301 |
| 5,563,433 | 10/1996 | Nagata et al. | 257/301 |

FOREIGN PATENT DOCUMENTS

| 5-90528 | 4/1993 | Japan |
| 5-167035 | 7/1993 | Japan |
| 3-315543 | 11/1993 | Japan |
| 6-291276 | 10/1994 | Japan |
| 7-86434 | 3/1995 | Japan |

OTHER PUBLICATIONS

H. Sunami, et al., IEDM Tech. Dig., pp. 806–808, Dec. 1982.
M. Sakamoto et al., Buried Storage Electrode (BSE) Cell For Megabit DRAMs, IEDM 85, pp. 710–713, 1985.
N. Lu et al., The SPT Cell –A New Substate–Plate Trench Cell for DRAMs, IEDM 85, pp. 771–772, 1985.

*Primary Examiner*—Valencia Martin Wallace
*Attorney, Agent, or Firm*—Pollock, Vande Sande & Priddy

[57] ABSTRACT

A semiconductor substrate has two element forming regions and one element separation region between the two element forming regions. A shield electrode for electrically separating the two element forming regions is formed in the semiconductor substrate at the element separating region. A trench capacitor is formed in the semiconductor substrate at the element separation region. The trench capacitor has a trench, a first conductive layer covering at least the inner wall of the trench, a dielectric layer formed at least on the first conductive layer in the trench, and a second conductive layer formed at least on the dielectric layer in the trench. The shield electrode and the first conductive layer is made of the same layer. A transistor having a pair of impurity doped regions is formed in the semiconductor substrate at the element forming region, the second conductive layer of the trench capacitor is electrically connected to one of the pair of impurity doped regions of the transistor.

47 Claims, 22 Drawing Sheets

32 ELEMENT SEPARATION REGION | 30 ELEMENT FORMING REGION | 31 ELEMENT SEPARATION REGION

32 ELEMENT SEPARATION REGION    30 ELEMENT FORMING REGION    31 ELEMENT SEPARATION REGION

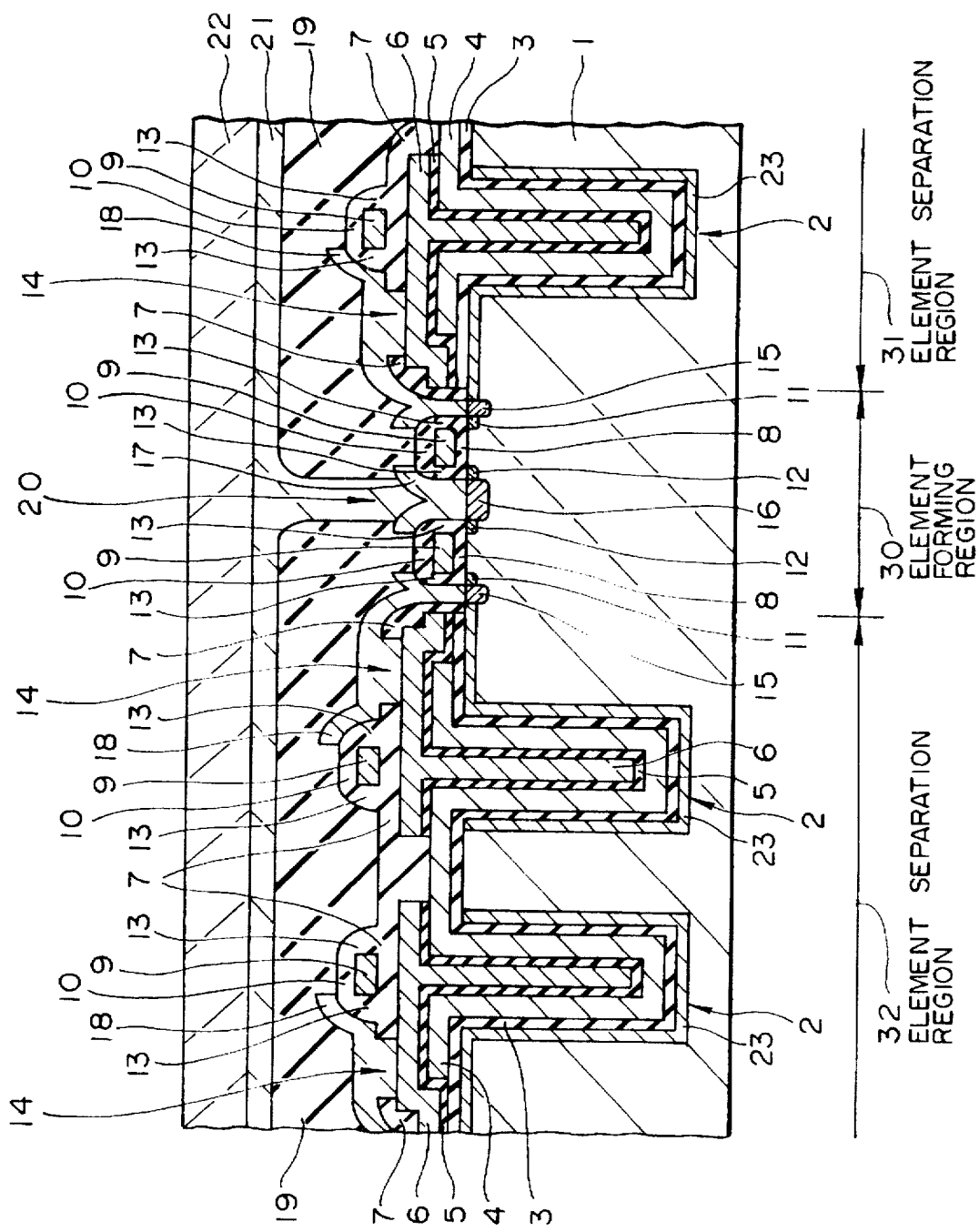

3032 ELEMENT SEPARATION REGION | 3030 ELEMENT FORMING REGION | 3031 ELEMENT SEPARATION REGION

3032 ELEMENT SEPARATION REGION | 3030 ELEMENT FORMING REGION | 3031 ELEMENT SEPARATION REGION

SEMICONDUCTOR STORAGE DEVICE

BACKGROUND OF THE INVENTION

1. Field of the Invention

The present invention relates to a semiconductor storage device and its manufacturing method, and more particularly to a semiconductor storage device and its manufacturing method suitable for a trench type DRAM (Dynamic Random Access Memory) having a field shield element separation structure.

2. Description of the Related Art

A stack type DRAM cell or a trench type DRAM cell is used as a one-transistor one-capacitor DRAM cell, the former has its capacitor formed not on the semiconductor substrate but between polysilicon layers, and the latter has its capacitor formed along the side wall of a trench which is formed in the semiconductor substrate (for example, H. Sunami, et al, IEDM Tech. Dig., pp. 806–808, December 1982 and M. Sakamoto et al, "BURIED STORAGE ELECTRODE (BSE) CELL FOR MEGABIT DRAMS", IEDM 85, pp. 710–713, 1985). Element separation types for DRAM cells include a LOCOS (Local Oxidation of Silicon) element separation type and a field shield element separation type, the former separating an element forming region (active region) for transistors or other elements by using a LOCOS structure, and the latter separating the active regions by using a shield electrode formed in an element separating region.

A so-called reverse trench type memory cell of a LOCOS element separation type is disclosed in "THE SPT CELL—A NEW SUBSTRATE-PLATE TRENCH CELL FOR DRAMS", IEDM 85, pp. 771–772, 1885, by N. Lu et al. The storage node of this memory cell for storing charge is formed in the trench to shorten the distance between adjacent trenches in order to improve integration of trench type DRAM cells. However, since the trench capacitor of such a reverse trench type memory cell of a LOCOS element separation type is formed in the semiconductor substrate at the element forming region, it is difficult to form the trench capacitor of large capacitance. In addition, since the element separation region by the LOCOS structure is required, there is a limit in high integration.

There is another disclosure of JP-A-6-291276 (corresponding to U.S. patent application Ser. No. 08/218, 947) in which a dielectric film is formed between a part of a lower electrode of a capacitor and a part of an element separation shield electrode in order to make a capacitor of large capacitance of a stack type DRAM cell of the field shield element separation type. However, such a stack type DRAM cell of the field shield element separation type uses a stacked capacitor, large capacitance is more difficult to be formed than a trench type DRAM cell which uses a trench capacitor.

SUMMARY OF THE INVENTION

It is an object of the present invention to provide a semiconductor storage device and its manufacturing method which realize large capacitance and high integration of trench type DRAM cells of a field shield element separation type.

A semiconductor storage device of this invention comprises:

a semiconductor substrate having two element forming regions and one element separation region disposed between the two element forming regions;

a shield electrode formed above the semiconductor substrate at the element separation region for electrically separating the two element forming regions; and a trench capacitor formed in the semiconductor substrate at the element separation region, the trench capacitor having a trench, a first conductive layer formed covering at least an inner wall of the trench, a dielectric layer formed at least on the first conductive layer in the trench, and a second conductive layer formed at least on the dielectric layer in the trench, wherein the shield electrode and the first conductive layer are made of the same single layer.

A method of manufacturing a semiconductor storage device of this invention including:

a semiconductor substrate having two element forming regions and one element separation region disposed between the two element forming regions;

a shield electrode formed above the semiconductor substrate at the element separation region for electrically separating the two element forming regions; and a trench capacitor formed in the semiconductor substrate at the element separation region, the trench capacitor having a trench, a first conductive layer formed covering at least an inner wall of the trench, a dielectric layer formed at least on the first conductive layer in the trench, and a second conductive layer formed at least on the dielectric layer in the trench, comprises the step of:

forming the shield electrode and the first conductive layer by using the same single layer.

BRIEF DESCRIPTION OF THE DRAWINGS

FIG. 7 is a schematic cross sectional view showing a modification of the reverse trench capacitor type DRAM shown in FIGS. 1 and 2.

DETAILED DESCRIPTION OF THE PREFERRED EMBODIMENTS (1st Embodiment)

Figure 1:
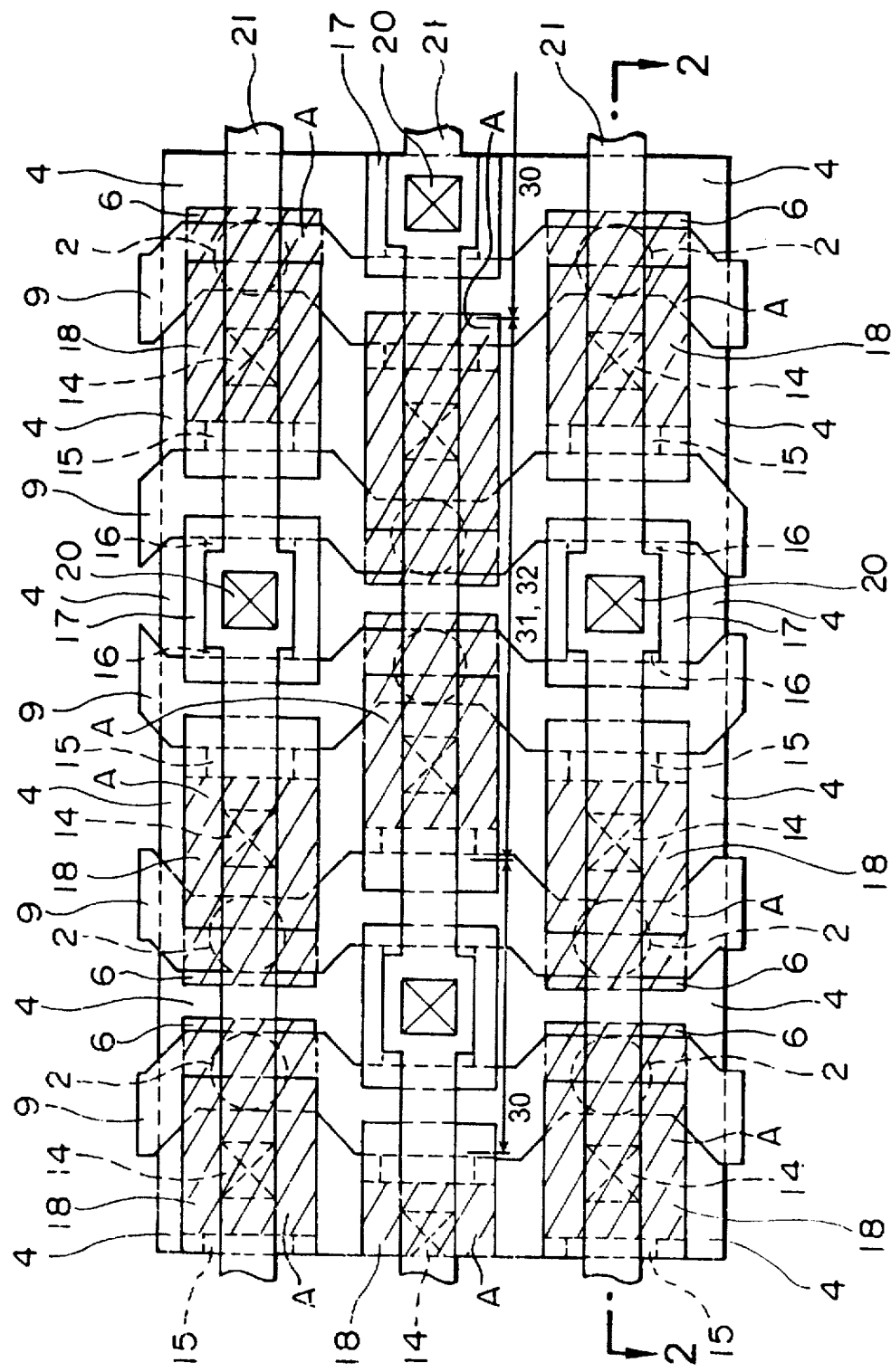
FIG. 1 is a schematic plan view showing a layout of a reverse trench capacitor type DRAM according to a first embodiment of the invention.
Figure 2:
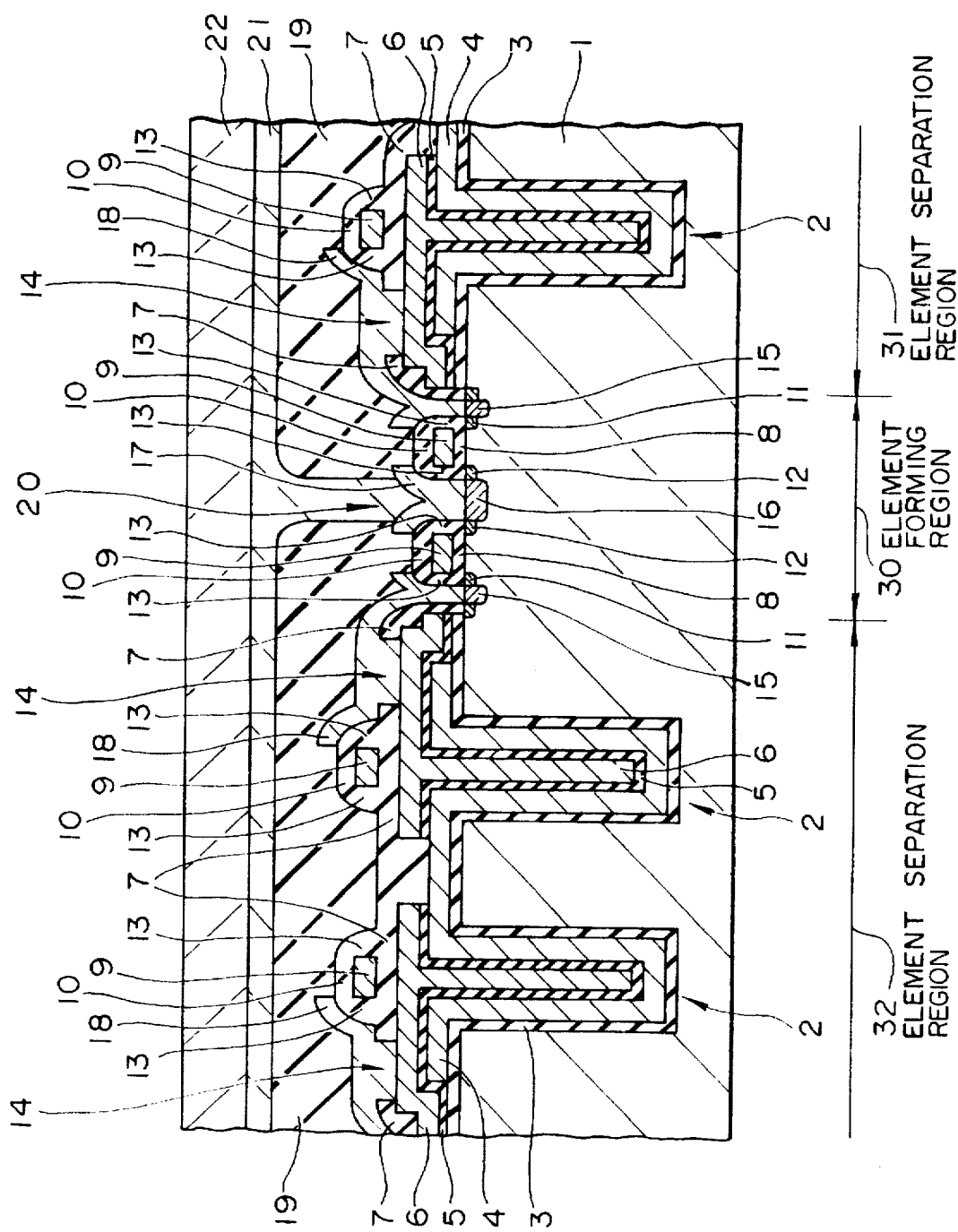
FIG. 2 is a schematic cross sectional view taken along line I—I in FIG. 1.

As shown in FIGS. 1 and 2, a reverse trench capacitor type DRAM of a semiconductor storage device according to the first embodiment of the invention is formed on a p-type silicon substrate 1 which has an element forming region 30 in which transistors are formed, and element separation regions 31 and 32 on both sides of the element forming region 30. Two transistors are formed side by side at the element forming region 30 of the p-type silicon substrate 1, having gate electrodes 9, low and high impurity concentration doped regions 11 and 15 functioning as a drain or source, and low and high impurity concentration doped regions 12 and 16 functioning as a source or drain. The high impurity concentration doped region 16 is shared by the two transistors. A trench 2 is formed at the element separation region 31 of the p-type silicon substrate 1 on the right side of FIG. 2. A trench capacitor is formed along the inner wall of the trench 2 and a cell plate electrode 4 is formed covering at least the inner wall of the trench 2. Also at the element separation region 31 of the p-type silicon substrate 1 on the right side of FIG. 2, a capacitor insulating film 5 is formed at least on the cell plate electrode 4 in the trench 2 and a storage electrode 6 is formed at least on the capacitor insulating film 5 in the trench 2. The cell plate electrode 4 functions both as a shield electrode for electrically separating the element forming region 30 from an adjacent element forming region (not shown) on the right side of the trench 2 and as a first conductive layer of the trench capacitor. The capacitor insulating film 5 functions as a dielectric layer of the trench capacitor. The storage electrode 6 functions as a second conductive layer of the trench capacitor. Therefore, one aspect of the reverse trench capacitor type DRAM resides in that the shield electrode for electrically separating two adjacent element forming regions and the first conductive layer of the trench capacitor are formed by the same single layer.

In the reverse trench capacitor type DRAM, the storage electrode 6 is electrically connected via a storage contact hole 14 to the high impurity concentration doped region 15 which is formed on the right side at the element forming region 30 and functions as the transistor source or drain. Therefore, in the reverse trench capacitor type DRAM, the storage electrode (upper electrode) 6 of the trench capacitor is electrically connected to the transistor source or drain, which is different from a conventional reverse trench capacitor type DRAM having a lower electrode of the trench capacitor electrically connected to the transistor source or drain.

A trench capacitor of the transistor on the left side of the element forming region 30 is formed in the manner similar to the above, in the p-type silicon substrate at the element separation region 32 on the left side in FIG. 2.

Next, the structure of the reverse trench capacitor type DRAM of this embodiment will be detailed with reference to FIG. 2.

Trenches 2 are formed in the p-type silicon substrate 1 at the element separation regions 31 and 32. On the inner walls of the trenches 2 and on the surfaces of the element separation regions 31 and 32, shield gate/cell plate electrodes 4 are formed with shield gate insulating films 3 being interposed between the electrodes and the inner walls or element separation region surfaces. The storage electrode 6 is formed on the shield gate/cell plate electrode 4 with the capacitor insulating film 5 being interposed there-between. The capacitor insulating film 5 has an ONO structure having a silicon nitride film sandwiched between silicon oxide films. A first cap oxide film 7 covers the storage electrode 6. As shown in FIG. 1, the storage electrode 6 provided for each memory cell and the underlying counter shield gate/cell plate electrode 4 constitute the trench capacitor. Over the element forming region 30 separated by the shield gate/cell plate electrode 4, a gate electrode 9, serving also as a word line, is formed on a gate oxide film 8. The gate electrode 9 is covered with a second cap oxide film 10 at its top surface and with a side wall insulating film 13 at its side wall. Under the opposite sides of the gate electrode 9, the low impurity concentration doped regions 11 and 12 as LDD (Lightly Doped Drain) regions and the high impurity concentration regions 15 and 16 are formed. On the surface of the high impurity concentration doped region 15 on the right side in FIG. 2, a first pad polysilicon film 18 to be used as an impurity doping source is formed. The first pad polysilicon film 18 extends in the direction parallel to the bit line 21, and is connected via the storage contact hole 14 formed in the first cap oxide film 7 to the storage electrode 6 of each memory cell.

The high impurity concentration region 16 on the left side in FIG. 2 is used in common by two gate electrodes 9. A second pad polysilicon film 17, to be used as an impurity doping source, is formed on the surface of the high impurity concentration doped region 16. As shown in FIG. 1, the bit line 21 is formed on a first interlayer insulating film 19 formed over the second pad polysilicon film 17 in the direction perpendicular to the direction of gate electrodes 9. The bit line 21 is connected to the second pad polysilicon film 17 via a bit contact hole 20 formed in the first interlayer insulating film 19.

With the reverse trench capacitor type DRAM constructed as above, the shield gate/cell plate electrode 4 can be operated as the cell plate electrode by applying a voltage of 1.65 V (0.5 Vcc, Vcc is a power source voltage) thereto, for example. Information can be stored in the capacitor formed between the shield gate/cell plate electrode 4 and the storage electrode 6, by charging or discharging the capacitor via the access transistor. A voltage (field threshold voltage) for generating a parasitic channel in the surface of the p-type silicon substrate 1 by applying the voltage to the shield gate/cell plate electrode 4 depends on the impurity concentration in the substrate surface. If the substrate surface impurity concentration is set to $10^{16}$ cm$^{-2}$ or higher, for example, the field threshold voltage can be set to 2.0 V or higher. The shield gate/cell plate electrode 4 also provides the function of the element separation structure. Since the shield gate/cell plate electrode 4 and the storage electrode 6, between which the capacitor insulating film 5 of the ONO structure is sandwiched, are also formed in the trench 2, the capacitance of a memory cell can be increased with ease without increasing the height of the memory cell.

Next, a method of manufacturing a semiconductor storage device according to the first embodiment of the invention will be described with reference to FIGS. 3A to 6B, by taking as an example a method of manufacturing the reverse trench capacitor type DRAM shown in FIGS. 1 and 2.

Figure 3A:
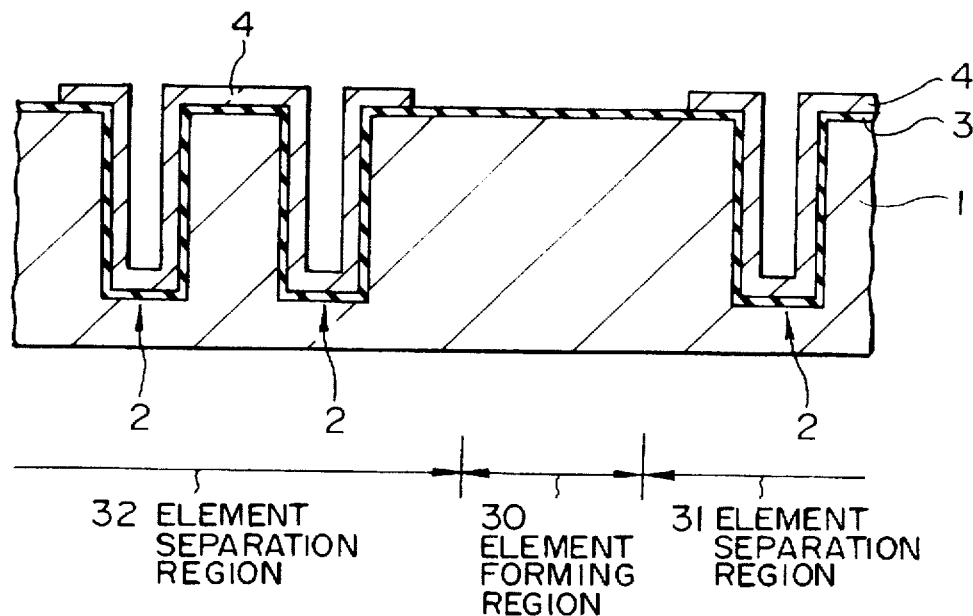
FIGS. 3A to 6B are schematic cross sectional views illustrating a method of manufacturing the reverse trench capacitor type DRAM shown in FIGS. 1 and 2, in the order of manufacturing processes.

First, as shown in FIG. 3A, a p-type silicon substrate 1 having a substrate surface impurity concentration of $10^{16}$ cm$^{-2}$ or higher is selectively etched by using a compound containing fluorine, such as $CF_4$, $SF_6$, and $CClF_4$, to form a trench 2 having a diameter of about 0.5 μm and a depth of about 3 to 4 μm. A shield gate insulating film (pad oxide film) 3 is formed through chemical vapor deposition (CVD) or thermal oxidation. Thereafter, a polysilicon film doped with n-type impurities such as phosphorous and arsenic is formed through CVD, and the polysilicon film on the element forming region 30 is selectively etched to form a shield gate/cell plate electrode 4.

Figure 3B:
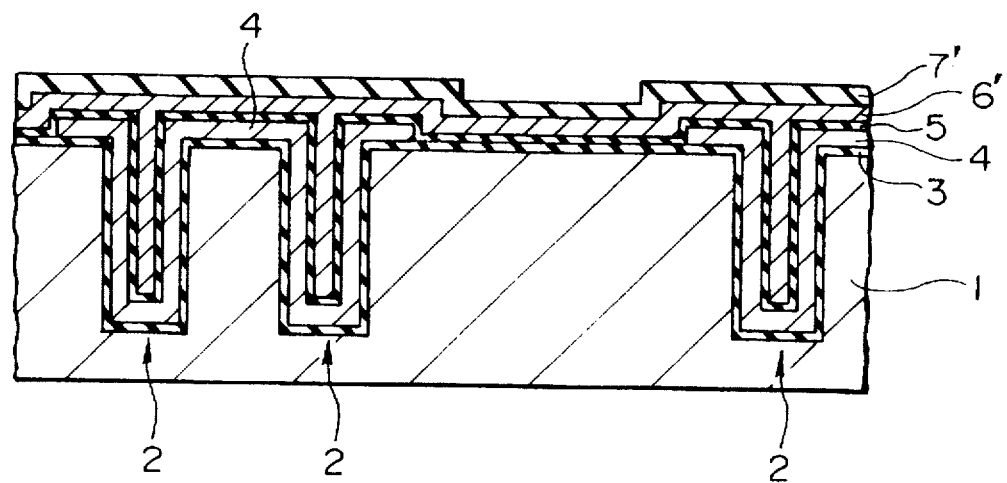

Next, as shown in FIG. 3B, a silicon nitride film is deposited through CVD on the shield gate/cell plate electrode 4 and subjected to a heat treatment for about 15 to 30 minutes at a temperature of 850° to 900° C. under a steam or water vapor atmosphere to thereby form a capacitor insulating film 5 of the ONO structure. Thereafter, a polysilicon film 6' and a silicon oxide film 7', doped with n-type impurities such as phosphorous and arsenic are sequentially deposited through CVD.

Figure 4A:
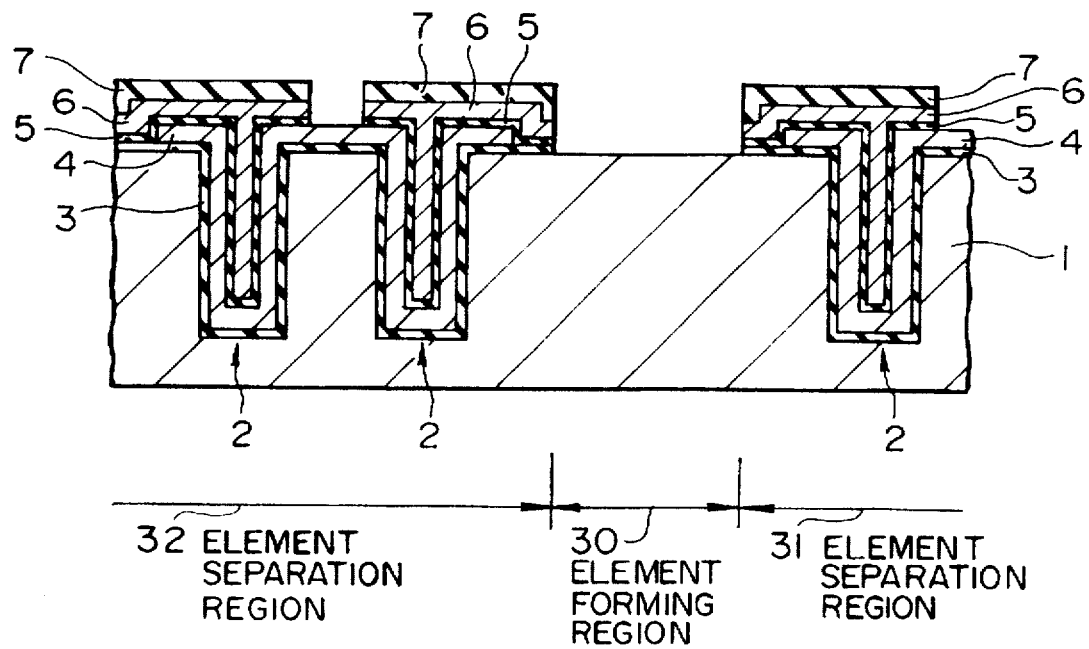

Next, as shown in FIG. 4A, the silicon oxide film 7', polysilicon film 6', capacitor insulating film 5, and shield gate insulating film 3 at the element forming regions 30 are selectively removed, and the silicon oxide film 7', polysilicon film 6', and capacitor insulating film 5 at the element separation regions 31 and 32 are selectively removed to thereby separate the polysilicon film 6' of each memory cell and form a storage electrode 6 and a first cap oxide film 7 having the patterns shown in FIG. 1.

Figure 4B:
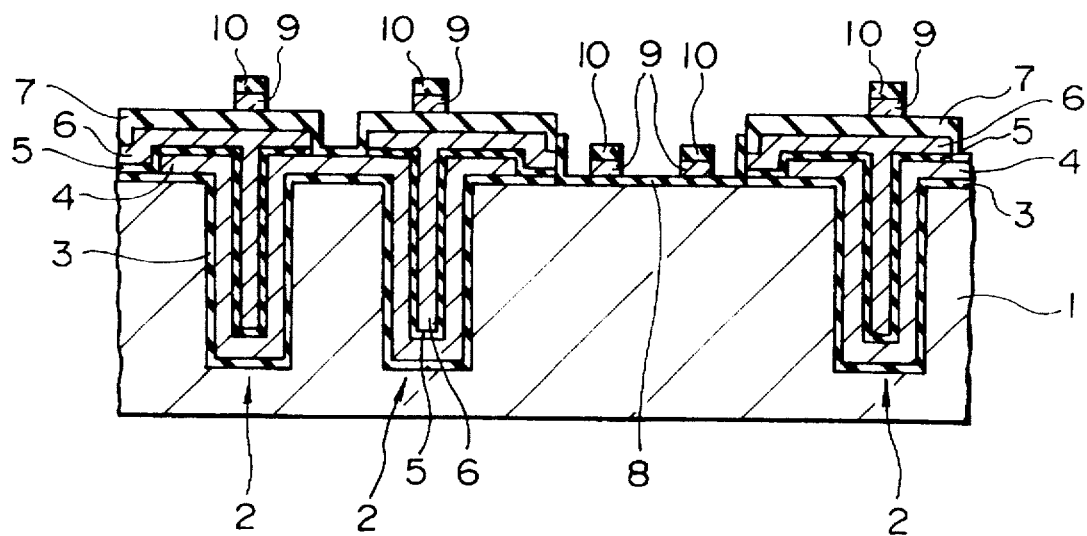

Next, as shown in FIG. 4B, a gate oxide film 8 is formed at the element forming region 30 by a heat treatment for about 15 to 30 minutes at a temperature of 700° to 800° C. under a steam atmosphere. Thereafter, a polysilicon film doped with n-type impurities and a silicon oxide film are deposited through CVD and patterned to form a gate electrode 9 as the word line and a second cap oxide film 10.

Figure 5A:
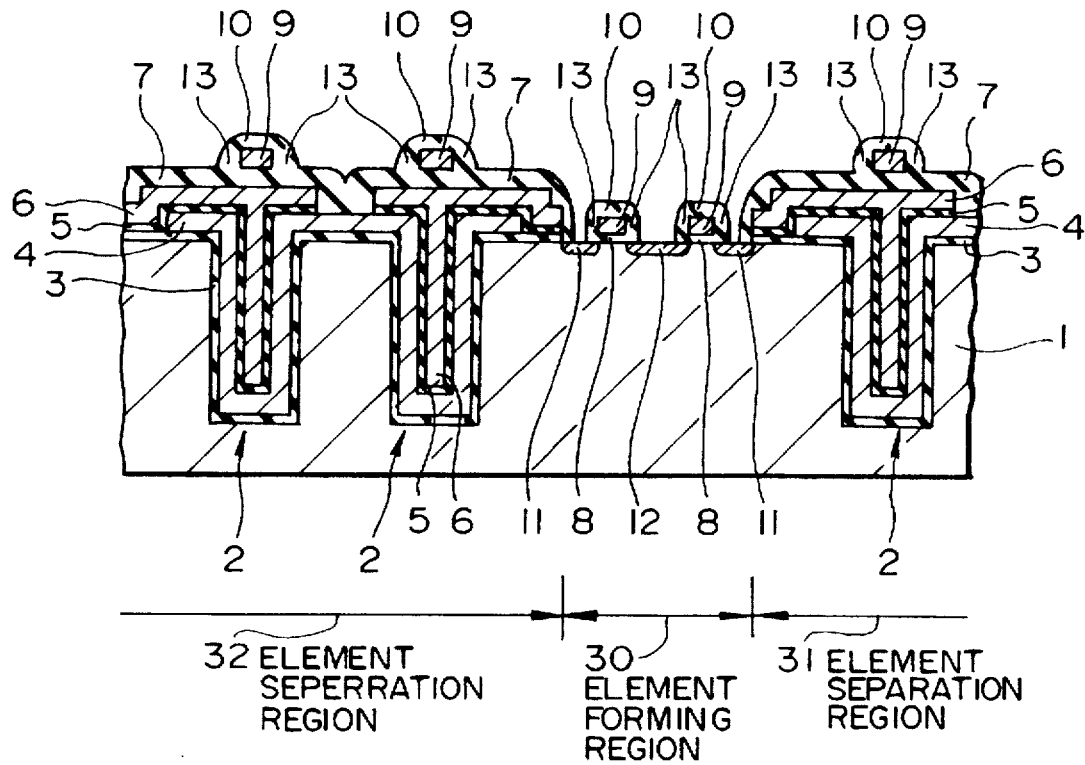

Next, as shown in FIG. 5A, by using the shield gate/cell plate electrodes 4, storage electrodes 6, and gate electrodes 9 as a mask, n-type impurity ions are implanted in a self-alignment manner to form low impurity concentration doped regions 11 and 12 as the LDD layers of the access transistor. If phosphorous is used as the n-type impurity, ion implantation is performed at an energy of 50 to 70 keV and a dose of 1 to $3\times10^{13}$ cm$^{-2}$. Thereafter, a silicon oxide film is deposited through CVD and etched back to form a side wall insulating film 13 at the side walls of the gate electrode 9. When the side wall insulating film 13 is formed at the side walls of the gate electrode 9, the side wall insulating film is also formed at the side walls of the shield gate/cell plate electrode 4 and storage electrode 6.

Figure 5B:
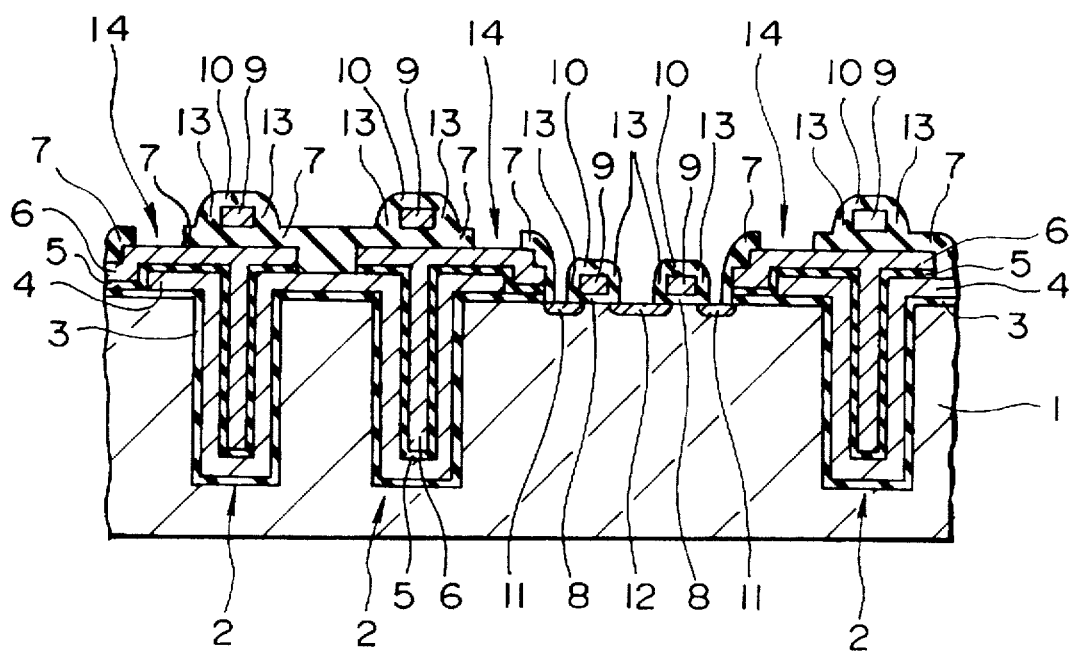

Next, as shown in FIG. 5B, the first cap oxide film 7 on the storage electrode 6 is selectively removed through photolithography and etching to form a storage contact 14.

Figure 6A:
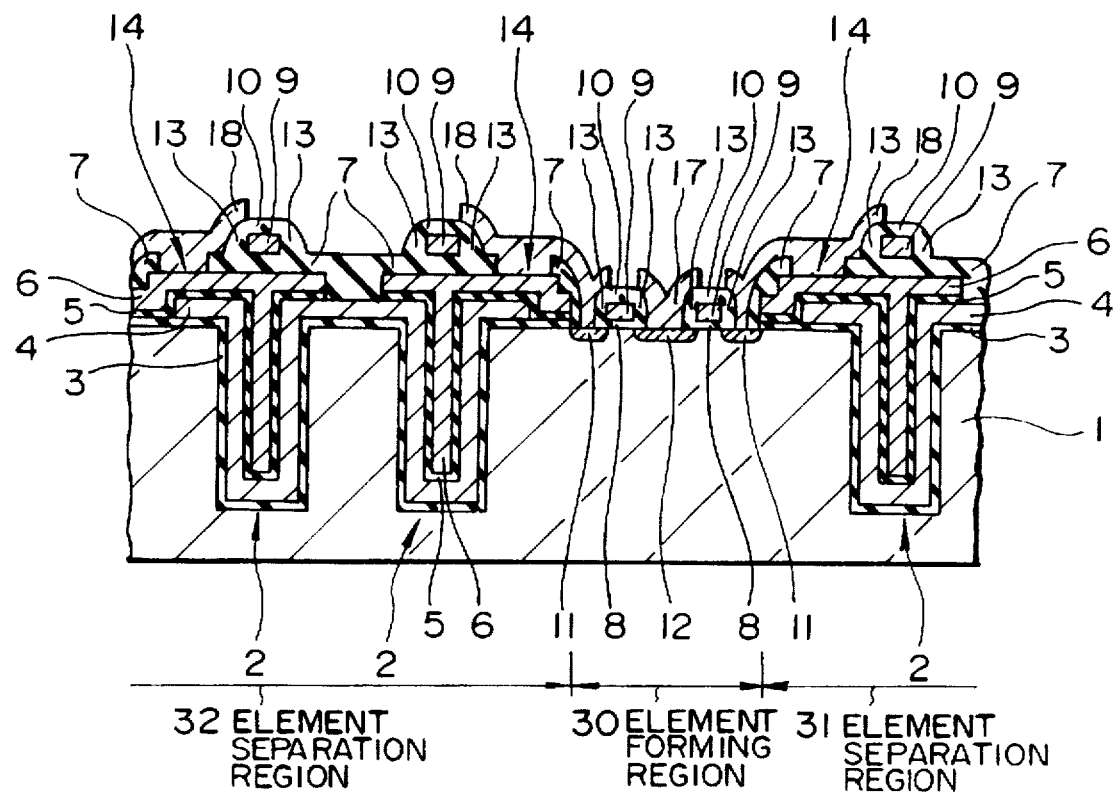

Next, as shown in FIG. 6A, a polysilicon film is deposited by CVD and patterned to form a second pad polysilicon film 17 and a first pad polysilicon film 18. The second pad polysilicon film 17 covers the p-type silicon substrate 1 at the low impurity concentration doped region 12, and the first pad polysilicon film 18 covers the p-type silicon substrate 1 at the low impurity concentration doped region 11, extends in the direction parallel to a bit line 21, and is connected via a storage contact hole 14 to the storage electrode 6. Under the conditions of an energy of 80 to 90 keV and a dose of 1 to $3\times10^{16}$ cm$^{-2}$, n-type impurity ions of arsenic are implanted into the second pad polysilicon film 17 and first pad polysilicon film 18. This ion implantation may be performed before the polysilicon layer is patterned.

Figure 6B:
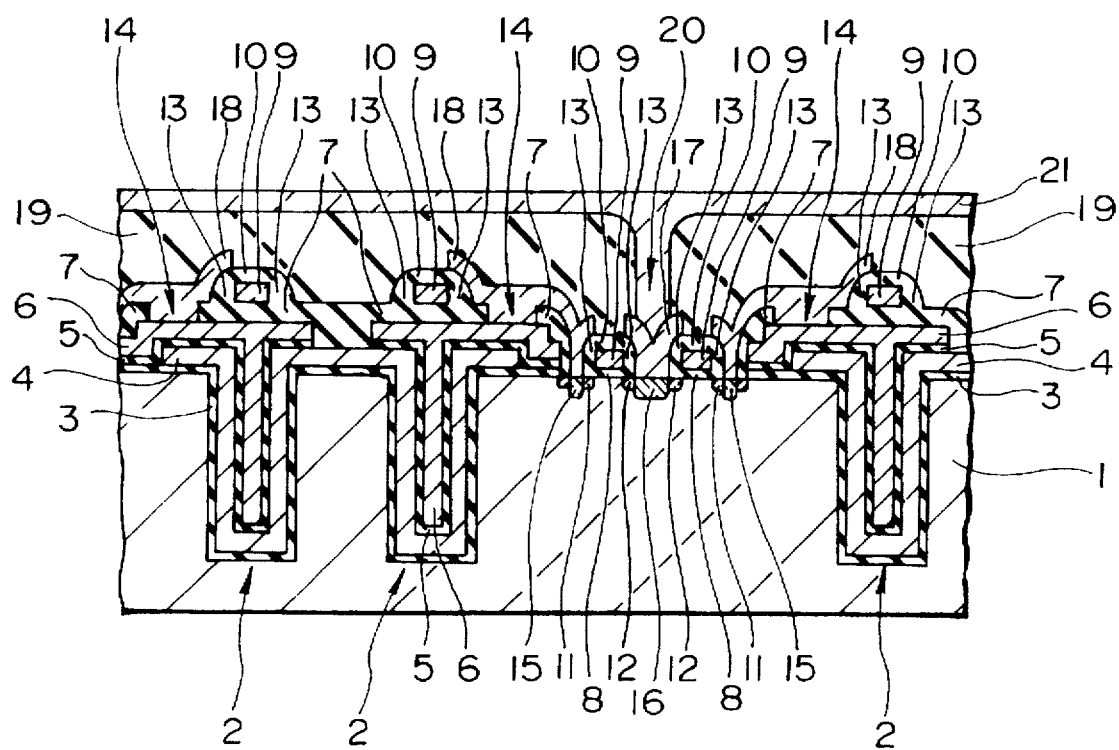

Next, as shown in FIG. 6B, a silicon oxide film containing boron and phosphorous is deposited through CVD to form a first interlayer insulating film 19 (hereinafter called a BPSG film 19). Thereafter, the BPSG film 19 is reflowed to planarize its surface by a heat treatment at a temperature of 850° to 900° C., and at the same time, n-type impurities in the second and first pad polysilicon films 17 and 18 are diffused into the p-type silicon substrate 1 to form the high impurity concentration doped regions 15 and 16 as the source/drain. The BPSG film 19 on the second pad polysilicon film 17 is selectively removed through photolithography and etching to form a bit contact hole 20. Thereafter, an aluminum film is deposited through sputtering, patterned through photolithography and etching to form the bit line 21 connected via the bit contact hole 20 to the second pad polysilicon film 17.

The first embodiment of the invention has been described above. The invention is not limited to this embodiment, but various changes are possible. For example, as shown in FIG. 7, an n-type impurity doped region 23 connected to the high impurity concentration region 15 may be formed along the surfaces of the trench and element separation regions 31 and 32 for each memory cell. With this structure, the capacitance of the capacitor of each memory cell can be increased, the capacitor having the shield gate/cell plate electrode 4 as the counter electrode and the shield gate insulating film 3 as the capacitor insulating film. The n-type impurity doped region 23 is formed in the following manner. After the trenches 2 are formed in the semiconductor substrate 1, the semiconductor substrate 1, at the region other than the hatched areas A shown in FIG. 1, is covered with a resist film (not shown). Thereafter, by using the resist film (not shown) as a mask, n-type impurities are implanted into the semiconductor substrate 1 only at the hatched areas A and trenches 2. Thereafter, the semiconductor substrate 1 is subjected to a heat treatment to form the n-type impurity doped regions 23 in the n-type impurity doped hatched areas A of the semiconductor substrate 1 and in the trenches 2. This hatched area A is an area including at least the whole inner surface of the trench 2. The n-type impurity doped region 23 is formed so as to be connected to the low impurity concentration doped region 8 or high impurity concentration doped region 15. The n-type impurity doped region 23 is formed so as to face the shield gate/cell plate electrode 4 via the shield gate insulating film 3.

The semiconductor storage device shown in FIG. 7 can be formed by similar processes (referring to FIGS. 3A–6B) of the semiconductor storage device manufacturing method of the first embodiment, after the n-type impurity doped region 23 is formed and the resist film (not shown) is removed.

Furthermore, the capacitor insulating film 5 may be formed by a high dielectric film such as a $TaO_5$ film or a $BaTiO_3$ film. The gate electrode 9 and bit line 21 may be made of a silicide film or a polycide film of tungsten and molybdenum. The high impurity concentration doped regions 15 and 16 may be formed after the side wall insulating films 13 are formed through ion implantation using the gate electrodes 9 and side wall insulating films 13 as a mask.

In the first embodiment, although the shield gate/cell plate electrode 4 is formed on the shield gate insulating film 3, the shield gate/cell plate electrode 4 directly covering the inner wall of the trench 2 may be formed without forming the shield gate insulating film 3. In this case, the shield gate/cell plate electrode 4 may be a conductive layer which includes a first portion and a second portion. The first portion is formed on the semiconductor substrate 1 and applied with a predetermined potential to electrically separate adjacent element forming regions 30 formed in the surface of the semiconductor substrate 1. The second portion, electrically connected to the first portion, is made of the same layer as the first portion and covers at least the inner wall of the trench 2. In this manner, without forming the shield gate/cell plate electrode 4 on the shield gate insulating film 3, adjacent element forming regions 30 can be electrically separated.

(2nd Embodiment)

Figure 8A:
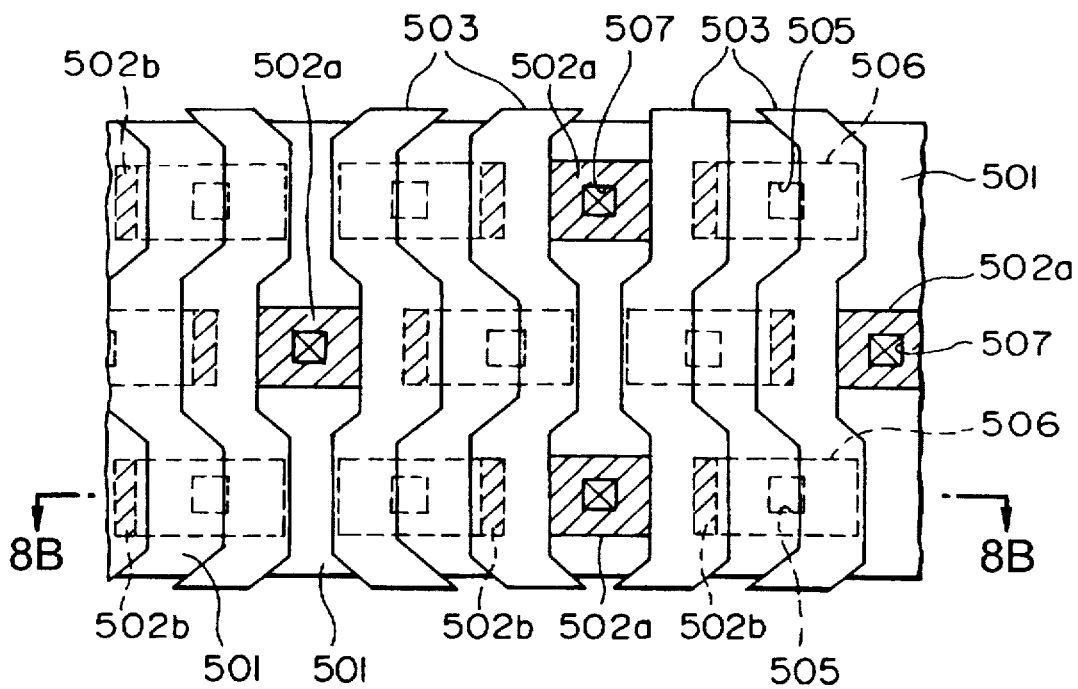
FIG. 8A is a schematic plan view showing a layout of a reverse trench capacitor type DRAM according to a second embodiment of the invention.
Figure 8B:
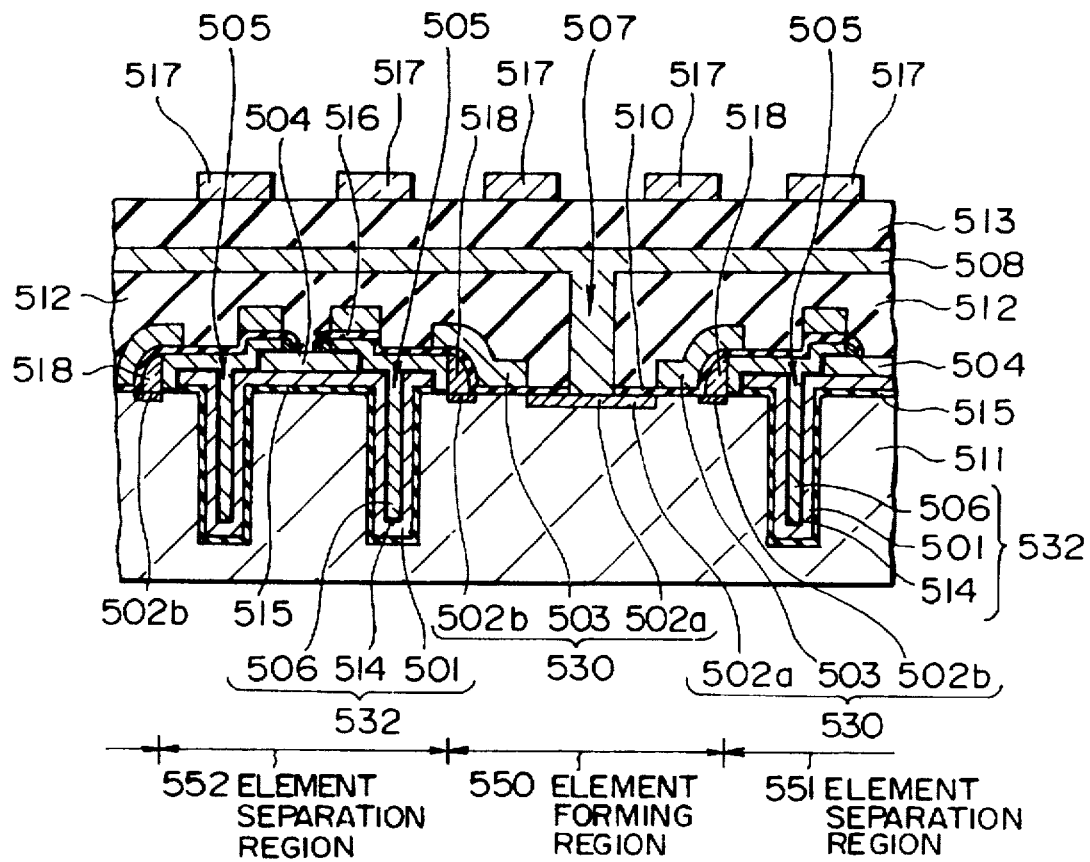
FIG. 8B is a schematic cross sectional view taken along line A—A in FIG. 8A.

As shown in FIGS. 8A and 8B, in a reverse trench capacitor type DRAM of a semiconductor storage device according to the second embodiment of the invention, one DRAM cell is constituted by a MOS transistor 530 of a transfer gate formed at an element forming region 550 of a p-type silicon substrate 511, and a trench capacitor 532 formed along the inner wall of a trench 505 in the p-type silicon substrate 511 at an element separation region 551, 552.

The p-type silicon substrate 511 has a surface impurity concentration of $1 \times 10^{16}$ cm$^{-2}$ or higher. The MOS transistor 30 has a gate electrode (word line) 503 and a pair of impurity doped regions 502a and 502b functioning as the source and drain. The gate electrode 503 is formed over the p-type silicon substrate 511 with a gate oxide film 510 being interposed between the gate electrode 503 and the substrate surface 511. The pair of impurity doped regions 502a and 502b are formed nearby in the surface of the p-type silicon substrate 511 and face the channel under the gate electrode 503. Two MOS transistors 530 are formed side by side in one element forming region 550 and share the impurity doped region 502a. The impurity doped region 502a is electrically connected to a bit line 508 via a bit contact hole 507 formed in a BPSG film 512 serving as an interlayer insulating film. The gate electrode (word line) 503 and bit line 508 are made of a polycide wiring layer which is a laminate of a polysilicon film and a silicide film.

The trench capacitor 532 is constituted by a cell plate electrode 501 made of a polysilicon film, a capacitor insulating film 514 made of an ONO film, and a storage electrode 506 made of a polysilicon film. Specifically, the trench capacitor 532 is constituted by the cell plate electrode 501 formed on a pad oxide film 515 covering at least the inner wall of the trench 505, the capacitor insulating film 514 formed at least on the cell plate electrode 501 in the trench 505, and the storage electrode 506 formed at least on the capacitor insulating film 514 in the trench 505 and facing the cell plate electrode 501. A side wall conductive film 518, formed on the side wall of the storage electrode 506, is made of phosphorous doped polysilicon so that it is electrically conductive. The storage electrode 506 is therefore electrically connected to the impurity doped region 502b of the MOS transistor 530 via the side wall conductive film 518.

The trench capacitor 532 is of a reverse trench type that the storage electrode 506 for storing electric charge is formed in the trench 505. Therefore, leakage current between adjacent trenches 505 is rarely generated so that trenches 505 can be formed relatively near each other and integration can be improved.

The cell plate electrode 501 of the trench capacitor 532 is formed not only on the inner wall of the trench 505 at the element separation region 551, 552 but also on the p-type silicon substrate 511 via a pad oxide film 515. The cell plate electrode 501 also functions as a shield plate electrode of a field shield element separation structure for electrically separating the element forming region 550 and an adjacent element forming region (not shown).

A silicon oxide film 504 is formed on a part of the cell plate electrode 501 not covered with the capacitor insulating film 514. A cap oxide film 516 is formed on the storage electrode 506 and side wall conductive film 518. A BPSG film 513 is formed over the bit line 508, and a wiring pattern 517 is formed over the BPSG film 513.

With the reverse trench capacitor type DRAM of this embodiment, since the cell plate electrode 501 is formed on the p-type silicon substrate 511 via the pad oxide film 515, the potential at the cell plate electrode 501 can be controlled to be (½) Vcc=1.65 V, independent from the potential at the p-type silicon substrate 511. Therefore, the intensity of the electric field applied to the capacitor insulating film 514 can be made small. Accordingly, the lifetime of the capacitor insulating film 514 can be prolonged and leakage current can be suppressed considerably. It is therefore possible to increase the capacitance by thinning the capacitor insulating film 514, and hence a memory cell can be made finer.

If the surface impurity concentration of the p-type silicon substrate 511 is set to $10^{16}$ cm$^{-2}$ or higher, the threshold voltage at which a parasitic channel is generated at the element separation region 551, 552 is generally 2.0 V or higher. In the reverse trench capacitor type DRAM of this embodiment, one of the electrodes of the trench capacitor 532, i.e., the cell plate electrode 501, is applied with a potential of 1.65 V. Therefore, the conductivity type in the surface of the p-type silicon substrate 511 at the element separation region 551, 552 will not inverted and the parasitic channel will not be generated. In other words, the cell plate electrode 510 also functions as the shield plate electrode of the field shield element separation structure.

Next, a method of manufacturing a semiconductor storage device according to the second embodiment of the invention will be described with reference to FIGS. 9A to 11B, by taking as an example a method of manufacturing the reverse trench capacitor type DRAM shown in FIGS. 8A and 8B.

Figure 9A:
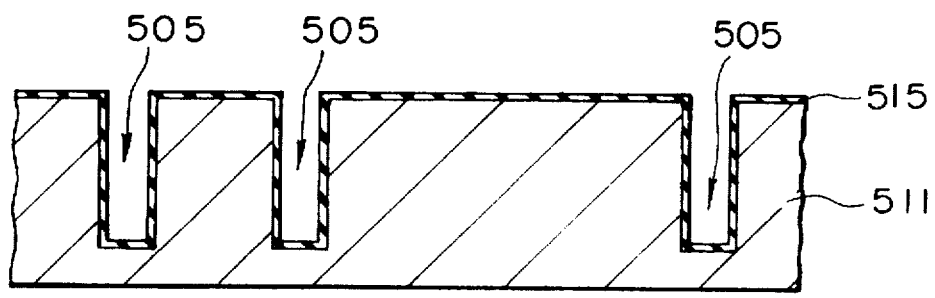
FIGS. 9A to 11B are schematic cross sectional views illustrating a method of manufacturing the reverse trench capacitor type DRAM shown in FIGS. 8A and 8B, in the order of manufacturing processes.

First, as shown in FIG. 9A, a p-type silicon substrate 511 is selectively etched by using compound containing fluorine as etching gas to form a trench 505 having a diameter of about 0.5 µm and a depth of about 4 to 5 µm. Thereafter, a pad oxide film 515 is formed on the whole surface of the p-type silicon substrate 511 including the inner wall of the trench 505.

Figure 9B:
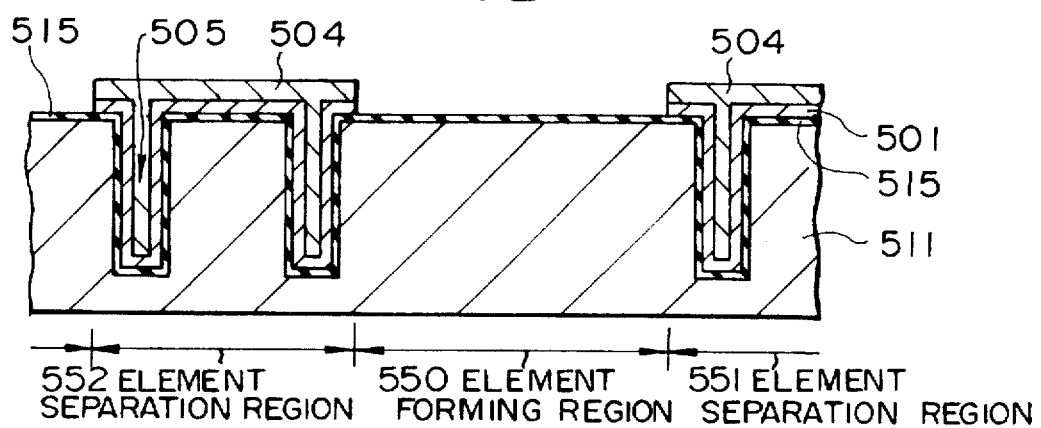

Next, as shown in FIG. 9B, a polysilicon film is formed on the whole surface of the p-type silicon substrate 511 including the inner wall of the trench 505, through CVD. A silicon oxide film is formed on the whole surface of the p-type silicon substrate 511, filling the inside of the trench 505. Thereafter, the silicon oxide film and polysilicon film are patterned to leave them only in the trench 505 and on the element separation regions 531 and 532 of the p-type silicon substrate 511 and form a cell plate electrode 501 and silicon oxide film 504.

Figure 9C:
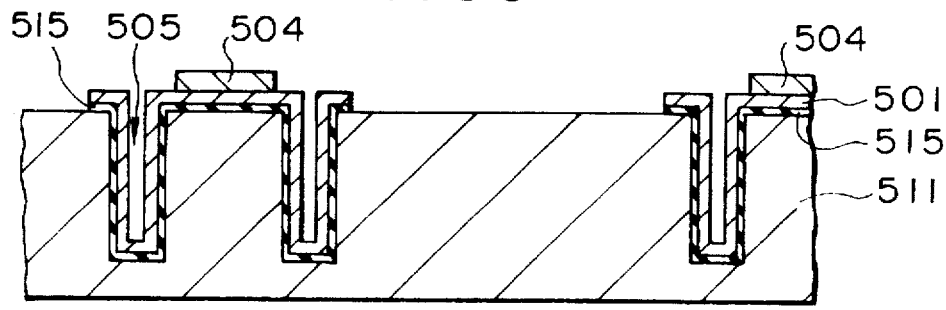

Next, as shown in FIG. 9C, selectively removed by using an etching mask of photoresist (not shown) and diluted solution containing hydrofluoric acid (HF), are the silicon oxide film 504 at the area not on the cell plate electrode 501 between adjacent trenches 505 and the pad oxide film 515 not covered with the cell plate electrode 501.

Figure 9D:
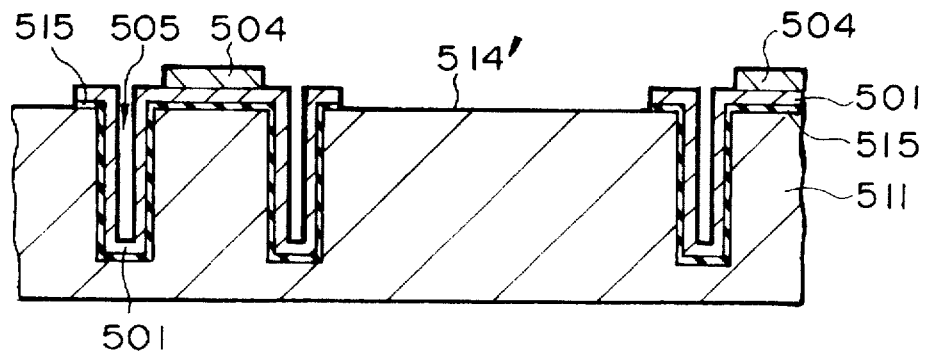

Next, as shown in FIG. 9D, a silicon nitride film is formed on the whole surface of the p-type silicon substrate 511, to about 5 nm thick, through CVD and subjected to a heat treatment for about 15 to 30 minutes at a temperature of 850° to 900° C. under a water vapor or steam atmosphere to thereby form a thermally oxidized silicon oxide film on the silicon nitride film. With the above processes, an ONO film 514' made of a native oxide film, a silicon nitride film, and a silicon oxide film are formed over the whole surface of the p-type silicon substrate 511.

Figure 10A:
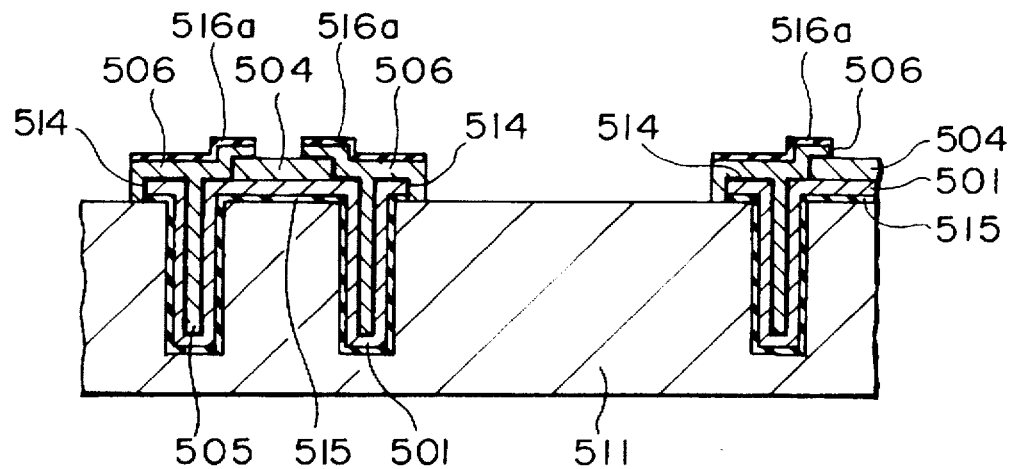

Next, as shown in FIG. 10A, an n-type polysilicon film is formed on the ONO film 514' through CVD facing the cell plate electrode 501 and filling the inside of the trench 505. A silicon oxide film 516a is formed on the polysilicon film through CVD. Thereafter, the polysilicon film filling the inside of the trench 505, silicon oxide film 516a, and ONO film 514' are selectively removed through anisotropic etching and leaving them only in the trench 505 and its nearby region. With this process, the polysilicon film filling the inside of the trench 505 is patterned to have a shape of a storage electrode 506, and a capacitor insulating film 514 of the ONO structure is formed.

Figure 10B:
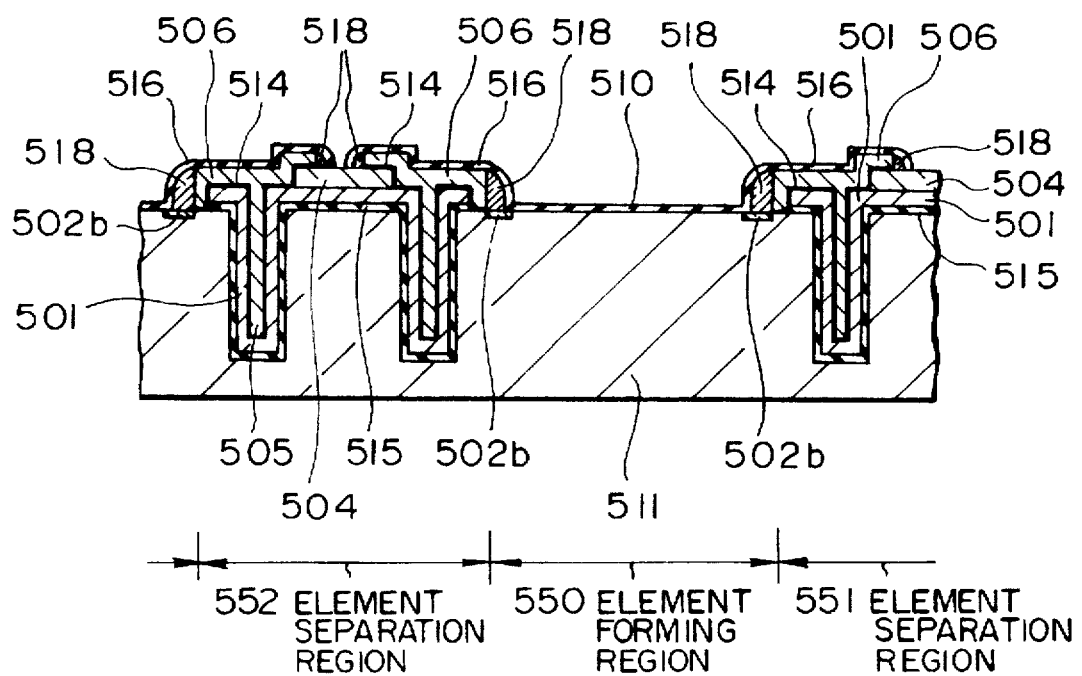

Next, as shown in FIG. 10B, an n-type polysilicon film is formed on the whole surface of the p-type silicon substrate 511, to about 20 nm thick through CVD, and etched back through anisotropic etching to form a side wall conductive film 518 at opposite side walls of the storage electrode 506. The side wall conductive film 518 is in electrical connection with the storage electrode 506. A heat treatment is then performed for 15 to 30 minutes at a temperature of 700° to 800° C. under a steam atmosphere. With this heat treatment, a thermally oxidized gate oxide film 510 is formed on the surface of the p-type silicon substrate 511 at the element forming region 550, and a cap oxide film 516 is formed on the side wall conductive film 518 and storage electrode 506. During this heat treatment, phosphorous in the side wall conductive film 518 diffuses into the p-type silicon substrate 511 to form an n-type impurity doped region 502b nearby in the surface of the p-type silicon substrate 511. The gate oxide film 510 may be formed by another heat treatment after removing the silicon oxide film formed at the element forming region by the first mentioned heat treatment.

Figure 11A:
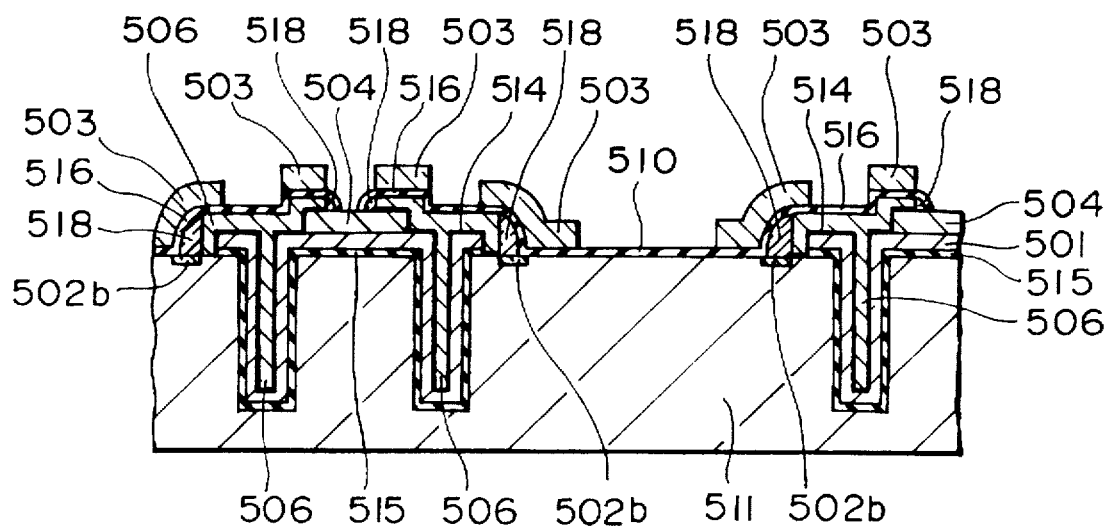

Next, as shown in FIG. 11A, an n-type polysilicon film and a silicide film are sequentially deposited on the whole surface of the p-type silicon substrate 511, and patterned to form a polycide gate electrode (word line) 503. In this case, the gate electrode 503 is patterned so as to leave it both on the side wall conductive film 518 and on the end portion of the storage electrode 506.

Figure 11B:
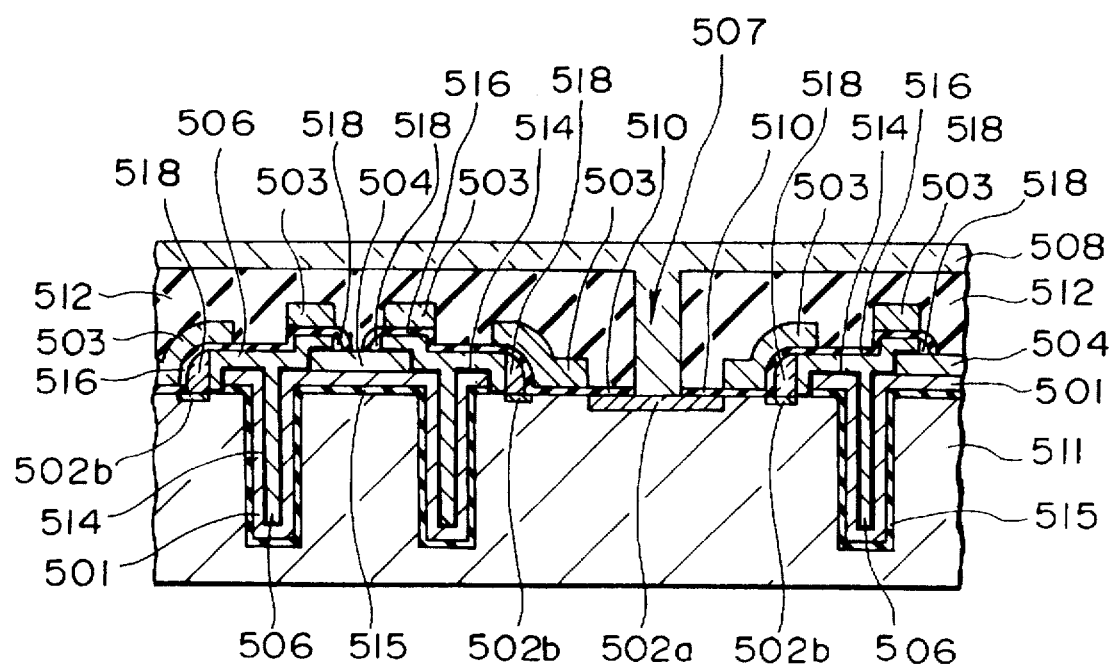

Next, as shown in FIG. 11B, by using the gate electrode 503 as a mask, phosphorous ions are implanted into the p-type silicon substrate 511 under the conditions of an acceleration voltage of 50 to 70 keV and a dose of about $3 \times 10^{15}$ to $5 \times 10^{15}$ cm$^{-2}$. With this ion implantation, an n-type impurity doped region 502a is formed in the surface of the p-type silicon substrate 511. Thereafter, a BPSG film 512 is deposited on the whole surface of the p-type silicon substrate 511 through atmospheric pressure CVD, and reflowed to planarize its surface. A bit contact hole 507 is formed in the BPSG film 512, reaching the n-type impurity doped region 502. A polycide bit line 508 is formed and patterned through sputtering and photolithography, connecting to the n-type impurity doped region 502a. Thereafter, a BPSG film 513 is deposited, and a wiring layer 517 is formed and patterned.

In the manufacturing method of this embodiment, phosphorous ions in the side wall conductive layer 518, formed on the side portion of the storage electrode 506 of the trench capacitor 532, are diffused into the p-type silicon substrate 511 to form one of the n-type impurity doped regions 502b of the MOS transistor 530. Therefore, the storage electrode 506 and n-type impurity doped region 502b can be connected in a self-alignment manner. It is therefore unnecessary to provide a particular design margin for the storage contact, further reducing the size of a memory cell.

(3rd Embodiment)

Figure 12:
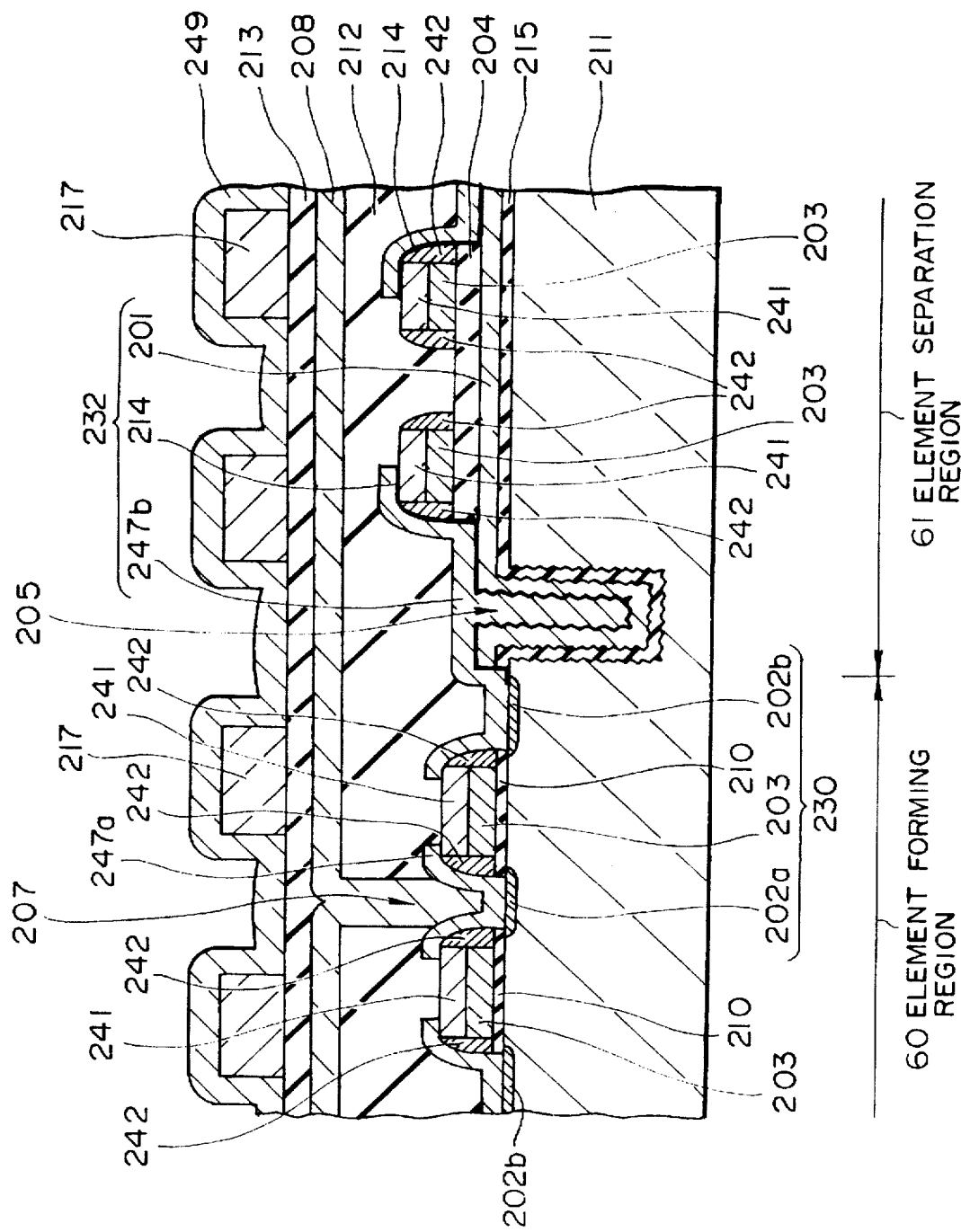
FIG. 12 is a schematic cross sectional view of a reverse trench capacitor type DRAM according to a third embodiment of the invention.

A reverse trench capacitor type DRAM of a semiconductor storage device according to the third embodiment is very different in the following points from the second embodiment shown in FIGS. 8A and 8B. Specifically, as shown in FIG. 12, the inner wall of a trench 205 formed in a silicon substrate 211 at an element separation region 601 is not flat but rugged. Both surfaces of a pad oxide film (shield gate oxide film) 215 in the trench 205, both surfaces of a polysilicon cell plate electrode 201, both surfaces of a capacitor insulating film 214 of the ONO structure and, the surface of a pad electrode 247b functioning as a storage electrode on the side of the capacitor insulating film 214, are all rugged. Therefore, the capacitor of the trench capacitor 232 of a reverse trench capacitor type DRAM of this embodiment can be made large.

Next, a method of manufacturing a semiconductor storage device according to the third embodiment of the invention will be described with reference to FIGS. 13A to 14C, by taking as an example a method of manufacturing the reverse trench capacitor type DRAM shown in FIG. 12.

Figure 13A:
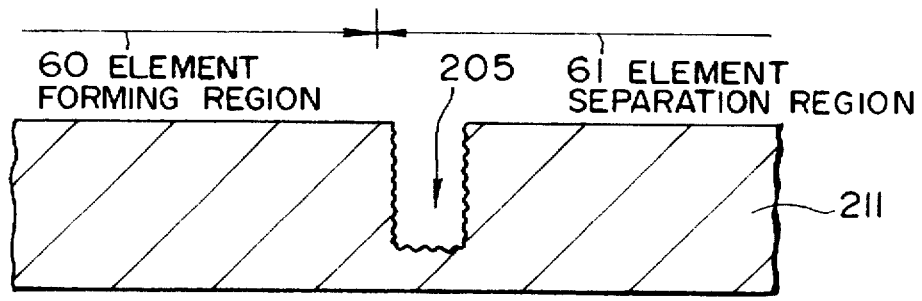
FIGS. 13A to 14C are schematic cross sectional views illustrating a method of manufacturing the reverse trench capacitor type DRAM shown in FIG. 12, in the order of manufacturing processes.

First, as shown in FIG. 13A, a silicon substrate 211 is selectively etched by using compound containing fluorine as etching gas to form a trench 205 at an element separation region 601, the trench 205 having a diameter of about 0.5 μm and a depth of about 4 to 5 μm. Thereafter, the inner wall of the trench 205 is made rugged by depositing a spherical polysilicon films (irregular or uneven polysilicon films) on the inner wall of the trench 205 through low pressure CVD (LPCVD) under the conditions of a film forming temperature of 570° to 580° C., a gas ($N_2$) pressure of 0.2 Torr, a gas ($SiH_4$) flow rate of about 200 sccm, and a deposition time of about 15 minutes, and thereafter by performing a heat treatment under the temperature conditions same as the film deposition temperature (refer to JP-A-7-86434).

Figure 13B:
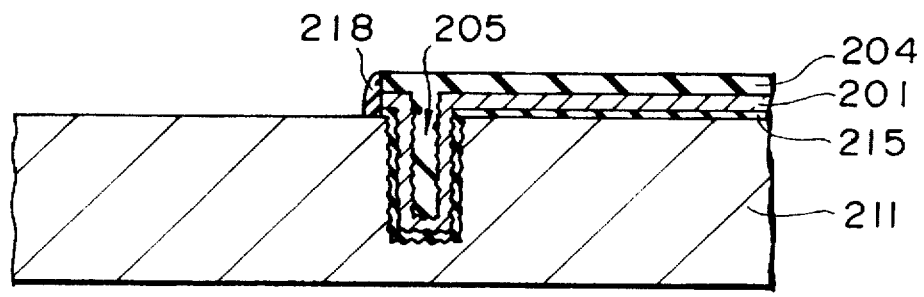

Next, an oxide film is formed over the whole surface of the silicon substrate 211 inclusive of the inner wall of the trench 205. Both surfaces of the oxide film in the trench 205 become rugged in conformity with the rugged surface of the inner wall of the trench 205. Thereafter, a polysilicon film is formed on the oxide film through CVD. Both surfaces of the polysilicon film in the trench 205 become rugged in conformity with the rugged surface of the oxide film. Then, a silicon oxide film is formed through CVD on the whole surface of the silicon substrate 211, filling the inside of the trench 205. Thereafter, the oxide film, polysilicon film, and silicon oxide film at the element forming region 600 are patterned to remove unnecessary regions and form a pad oxide film 215, a cell plate electrode 201, and a silicon oxide film 204 on the inner wall of the trench 205 and on the silicon substrate 211 at the element separation region 601, as shown in FIG. 13B.

Successively, a silicon oxide film is formed over the whole surface of the silicon substrate 211 and etched until the surface of the silicon substrate 211 at the element forming region 600 is exposed. With this process, as shown in FIG. 13B, a side wall oxide film 218 is formed on the side walls of the pad oxide film 215, cell plate electrode 201, and silicon oxide film 204. With the above processes, a field shield element separation structure having the cell plate electrode 201 as the shield plate electrode is formed.

Figure 13C:
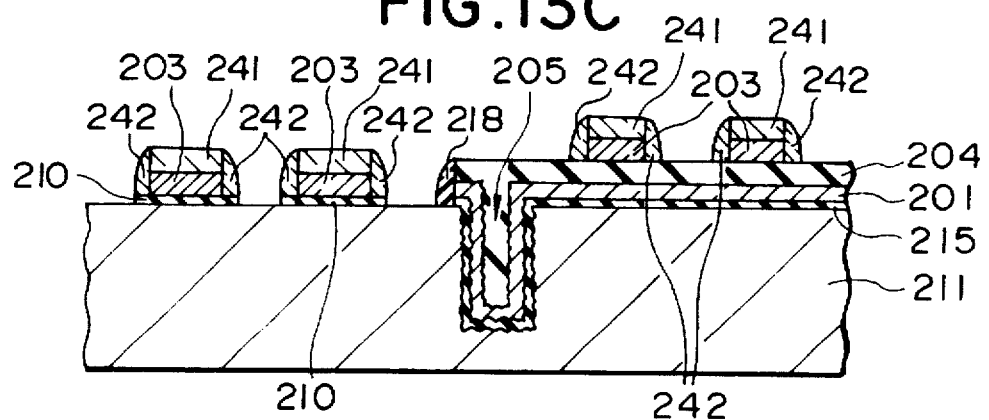

Next, as shown in FIG. 13C, a gate oxide film 210 is formed through thermal oxidation to a thickness of about 10 to 15 nm on the silicon substrate 211 at the element forming region 600 surrounded by the field shield element separation structure. Thereafter, sequentially formed on the gate oxide film 210 are a gate electrode 203 made of a phosphorous doped polysilicon layer having a thickness of about 100 to 300 nm and a cap nitride film 241 made of a silicon nitride film having a thickness of about 100 to 300 nm. After these layers are patterned, a silicon nitride film is formed on the whole surface of the silicon substrate 211, to about 100 to 300 nm thick, through CVD, and etched until the surface of the silicon substrate 211 at the element forming region 600 is exposed. In this manner, a side wall nitride film 242 is formed on the side walls of the cap nitride film 241 and gate electrode 203. With the above processes, a gate electrode structure is completed in which the gate electrode 203 is covered with the gate oxide film 210, cap nitride film 241, and side wall nitride film 242. The gate electrode structure formed on the field shield element separation structure is used for an adjacent memory cell.

Figure 13D:
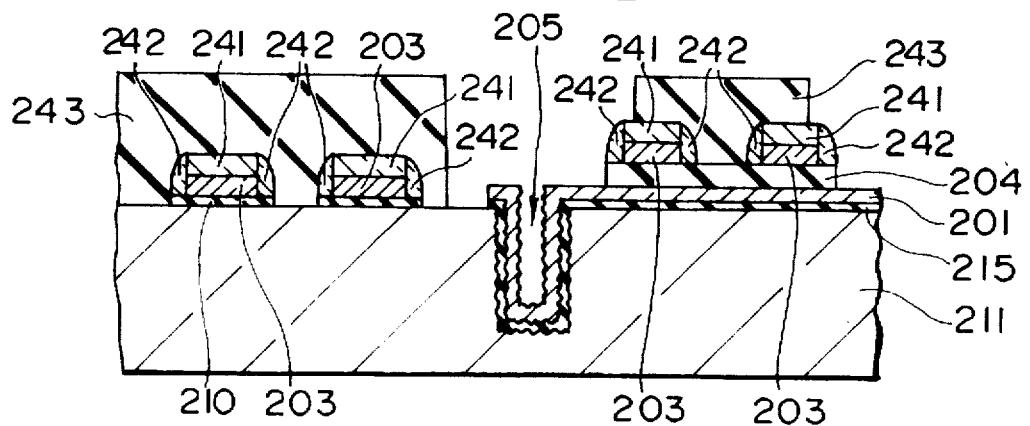

Next, as shown in FIG. 13D, a photoresist film 243 is formed and patterned to have an opening at the trench 205 and nearby area through photolithography. By using this photoresist pattern 243 as a mask, the silicon oxide film 204 and side wall oxide film 218 at the area not covered with the photoresist pattern 243 are anisotropically etched to thereby expose the cell plate electrode 201 in and near the trench 205. In this case, since the cap nitride film 241 and the side wall nitride film 242 cover the gate electrode 203 of the gate electrode structure formed on the field shield element separation structure, the gate electrode 203 can be prevented from being exposed and etched. Although not shown, the side wall oxide film 218 at the region other than the trench 205 and its nearby area is left unetched.

Figure 14A:
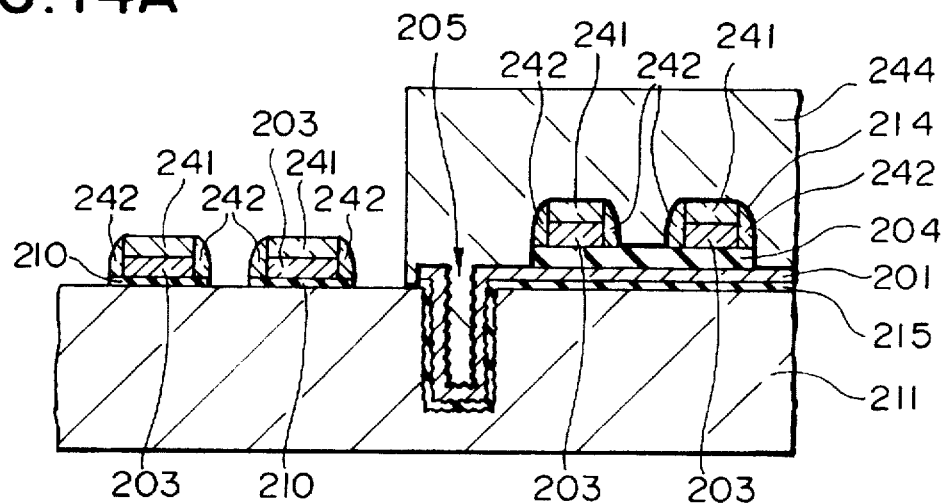

Next, as shown in FIG. 14A, after the photoresist pattern 243 is removed, a silicon nitride film is formed to about 5 nm thick through CVD on the whole surface of the silicon substrate 211 and subjected to a heat treatment for 15 to 30 minutes at a temperature of 850° to 900° C. under a steam atmosphere to form a thermally oxidized silicon oxide film on the silicon nitride film. With these processes, an ONO film made of a native oxide film, a silicon nitride film, and a silicon oxide film is formed over the whole surface of the silicon substrate 211. Thereafter, photoresist 244 is coated on the whole surface of the silicon substrate 211 and patterned through photolithography to cover the trench 205 and the field shield element separation structure. By using the photoresist pattern 244 as a mask, the ONO film is etched until the surface of the silicon substrate 211 is exposed, to thereby form a capacitor insulating film 214.

Figure 14B:
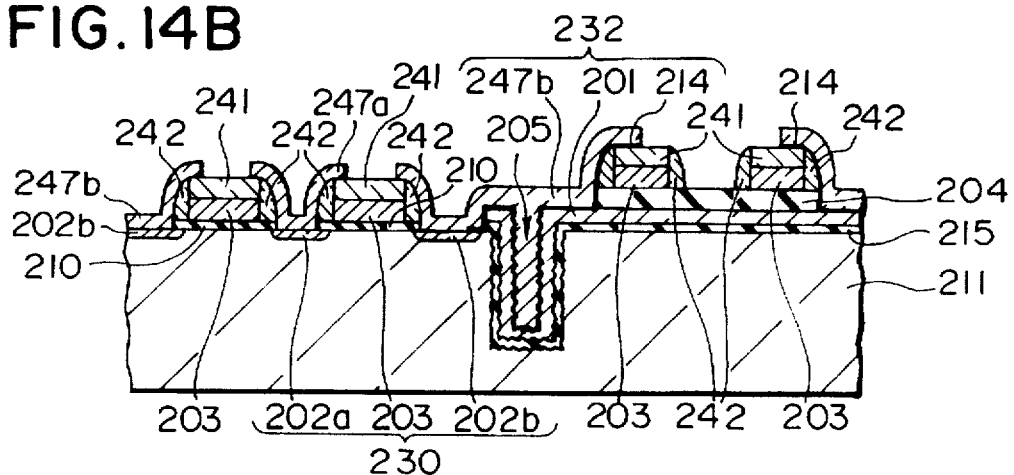
Figure 15:
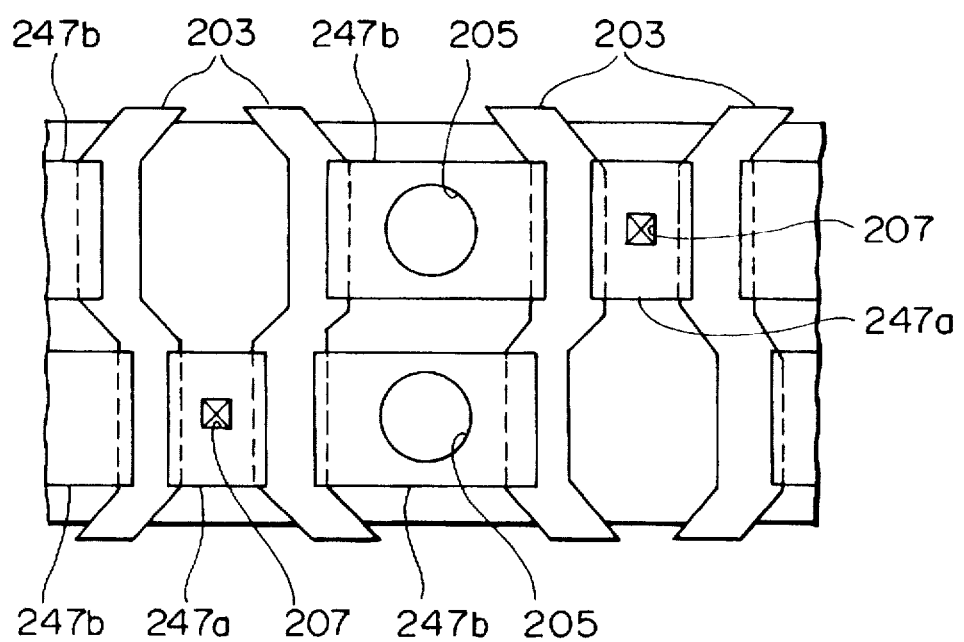
FIG. 15 is a schematic plan view showing a layout of the reverse trench capacitor type DRAM shown in FIG. 12.

Next, as shown in FIG. 14B, after the photoresist pattern 244 is removed, a polysilicon film is deposited through CVD over the whole surface of the silicon substrate 211, including the inner wall of the trench 205, filling the inside of the trench 205. This polysilicon film contacts the surface of the silicon substrate 211 exposed on opposite sides of the gate electrode 203, and faces the cell plate electrode 201 in the trench 205 via the capacitor insulating film 214. After phosphorus ions are implanted into the polysilicon film, the polysilicon film is anisotropically etched by using the photoresist layer (not shown) having a desired pattern, and cut on the cap nitride film 241 of each memory cell (refer to FIG. 15).

As a result, the polysilicon film becomes patterned pad electrodes 247a and 247b. The pad electrode 247b faces the cell plate electrode 201 in the trench 205 via the capacitor insulating film 214, and serves also as the storage electrode of the trench capacitor 232.

Thermal diffusion of phosphorous ions into the pad electrodes 247a and 247b forms a pair of impurity doped regions 202a and 202b nearby in the surface of the silicon substrate 211 on opposite sides of the gate electrode 203. With the above processes, a MOS transistor 230 is formed having the gate electrode 203 on the gate oxide film 210 and the impurity doped regions 202a and 202b as the source and drain. In this embodiment, the pad electrodes 247a and 247b allow the impurity doped regions 202a and 202b to have relatively shallow junctions and a large mask alignment margin for the contact hole 207 or the like.

Figure 14C:
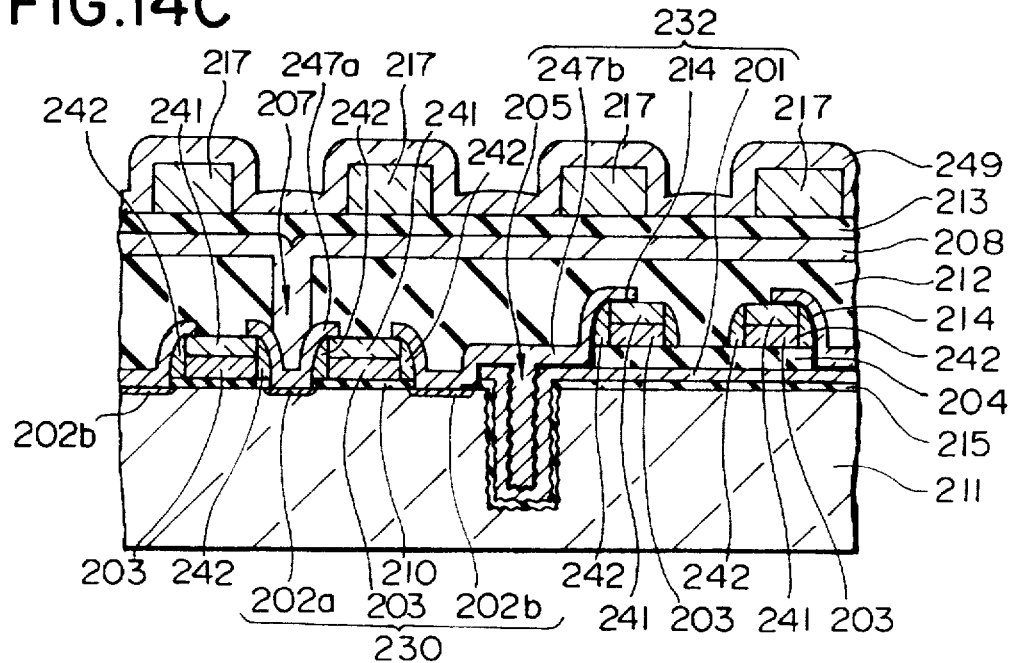

Next, as shown in FIG. 14C, a BPSG film 212 is deposited over the whole surface of the silicon substrate 211 through atmospheric pressure CVD and is reflowed to planarize its surface by a thermal treatment at a temperature of 850° to 900° C. After a contact hole 207 reaching the pad electrode 247a is formed in the BPSG film 212, a polycide bit line 208 connected to the pad electrode 247a is formed and patterned through sputtering and photolithography. Thereafter, a BPSG film 213 is formed, a wiring layer 217 is formed and patterned, and then a passivation film 249 is formed to complete a DRAM of this embodiment.

In the manufacturing method of this embodiment, since the silicon substrate 211 and capacitor insulating film 241 are both exposed immediately before the polysilicon film of the pad electrodes 247a and 247b is formed, the pad electrode 247b can be adapted to serve also as the storage electrode of the trench capacitor 232. Accordingly, an additional process for connecting the storage electrode to the MOS transistor source/drain is not necessary, and the structure of a memory cell can be simplified.

Another method of forming a rugged surface of the inner wall of the trench 205 is known as described in JP-A-5-167035, in which an amorphous silicon film is formed on the inner wall of the trench 205 through LPCVD using $SiH_4$ gas, and subjected to a heat treatment for one hour at a temperature of 570° C. while evacuating the inside of a process chamber. In this manner, nuclei are formed on the surface of the amorphous silicon film and a growth of crystal grains is induced to form a rough surface polysilicon film on the amorphous silicon film.

Still another method of forming an rugged surface of the inner wall of the trench 205 is known as described in JP-A-5-90528, in which fine particles of silicon are dispersed by a spray or the like, and by using these fine particles as nuclei, a polysilicon film is deposited through CVD.

A further method of forming an rugged surface of the inner wall of the trench 205 is described in JP-A-5-315543, in which an amorphous silicon film is formed through LPCVD under the conditions of a flow rate of 200 sccm of $SiH_4$ gas, a temperature of 550° C., a pressure of 1 Torr, a deposition time of 30 minutes, and annealed for 30 minutes under a nitrogen atmosphere while maintaining the temperature at 550° C. and stopping the reaction gas supply to thereby grow polycrystalline hemispherical-grain silicon (HGS silicon).

In the reverse trench capacitor type DRAM manufactured as above, since the silicon substrate 211 and plate electrode 201 are electrically insulated by the pad oxide film 215 as shown in FIG. 12, the potential of the cell plate electrode 201 can be controlled to be at (½) Vcc=1.65 V, independent from the silicon substrate 211. Therefore, the intensity of the electric field applied to the capacitor insulating film 214 can be made small. Accordingly, the lifetime of the capacitor insulating film 214 can be prolonged and leakage current can be suppressed considerably. It is therefore possible to increase the capacitance of the trench capacitor 232 by thinning the capacitor insulating film 214, and hence a memory cell can be made finer.

Instead of the cap nitride film 241 shown in FIG. 12, a cap insulating film of a two-layer structure having a lower silicon oxide film and an upper silicon nitride film may be used. Addition of the silicon oxide film enhances the insulation of the gate electrode 203.

(4th Embodiment)

In the reverse trench capacitor type DRAM shown in FIG. 12, the inner wall of the trench 205 is made rugged to broaden the effective counter area between the cell plate electrode 201 and pad electrode 247b, which serves as the storage electrode, of the trench capacitor 232 and to increase the capacitance thereof. However, in order to increase the capacitance of the trench capacitor 232, it is not necessarily required to make the inner wall of the trench 205 rugged, but as in the case of a reverse trench capacitor type DRAM of a semiconductor storage device according to the fourth embodiment of the invention, it may be sufficient to make rugged only the surface of a cell plate electrode 1201 in a trench 1205 on the side opposite to the inner wall of the trench 1205, both surfaces of a capacitor insulating film 1214, and the surface of a pad electrode 1247b on the side of the capacitor insulating film 1214.

Figure 16:
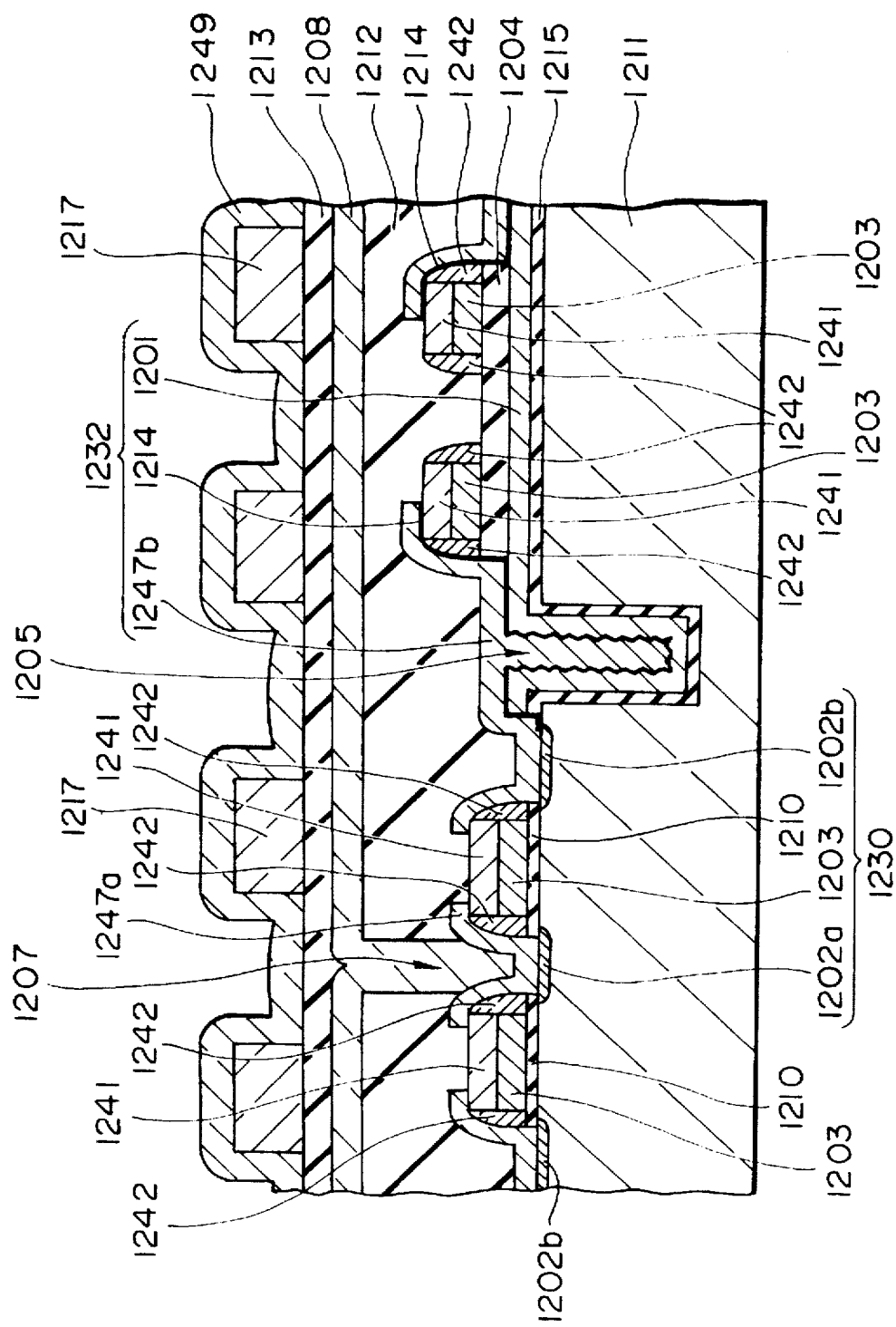
FIG. 16 is a schematic cross sectional view of a reverse trench capacitor type DRAM according to a fourth embodiment of the invention.

Next, a method of manufacturing a semiconductor storage device according to the fourth embodiment of the invention will be described, by taking as an example a method of manufacturing the reverse trench capacitor type DRAM shown in FIG. 16.

First, a silicon substrate 1211 is selectively etched by using compound containing fluorine, such as $CF_4$, $SF_6$, and $CClF_4$, to form a trench 1205 having a diameter of 0.5 μm and a depth of 4 to 5 μm. Thereafter, an oxide film is formed on the whole surface of the silicon substrate 1211 including the inner wall of the trench 1205, and thereafter a polysilicon film is formed on the oxide film through CVD. Thereafter, the surface of the polysilicon film is made rugged by depositing spherical polysilicon films (rugged or uneven polysilicon films) on the surface of the polysilicon film through LPCVD under the conditions of a film forming temperature of 570° to 580° C., a gas ($N_2$) pressure of 0.2 Torr, a gas ($SiH_4$) flow rate of about 200 sccm, and a deposition time of about 15 minutes, and thereafter by performing a heat treatment under the temperature conditions the same as the film deposition. Thereafter, the processes illustrated in FIGS. 13B to 14C are performed to manufacture a reverse trench capacitor type DRAM.

As the method of making the surface of the polysilicon film rugged, in addition to the above method, the methods described in the above-cited JP-A-5-167035, JP-A-5-90528, and JP-A-5-315543 may also be used.

(5th Embodiment)

Figure 17:
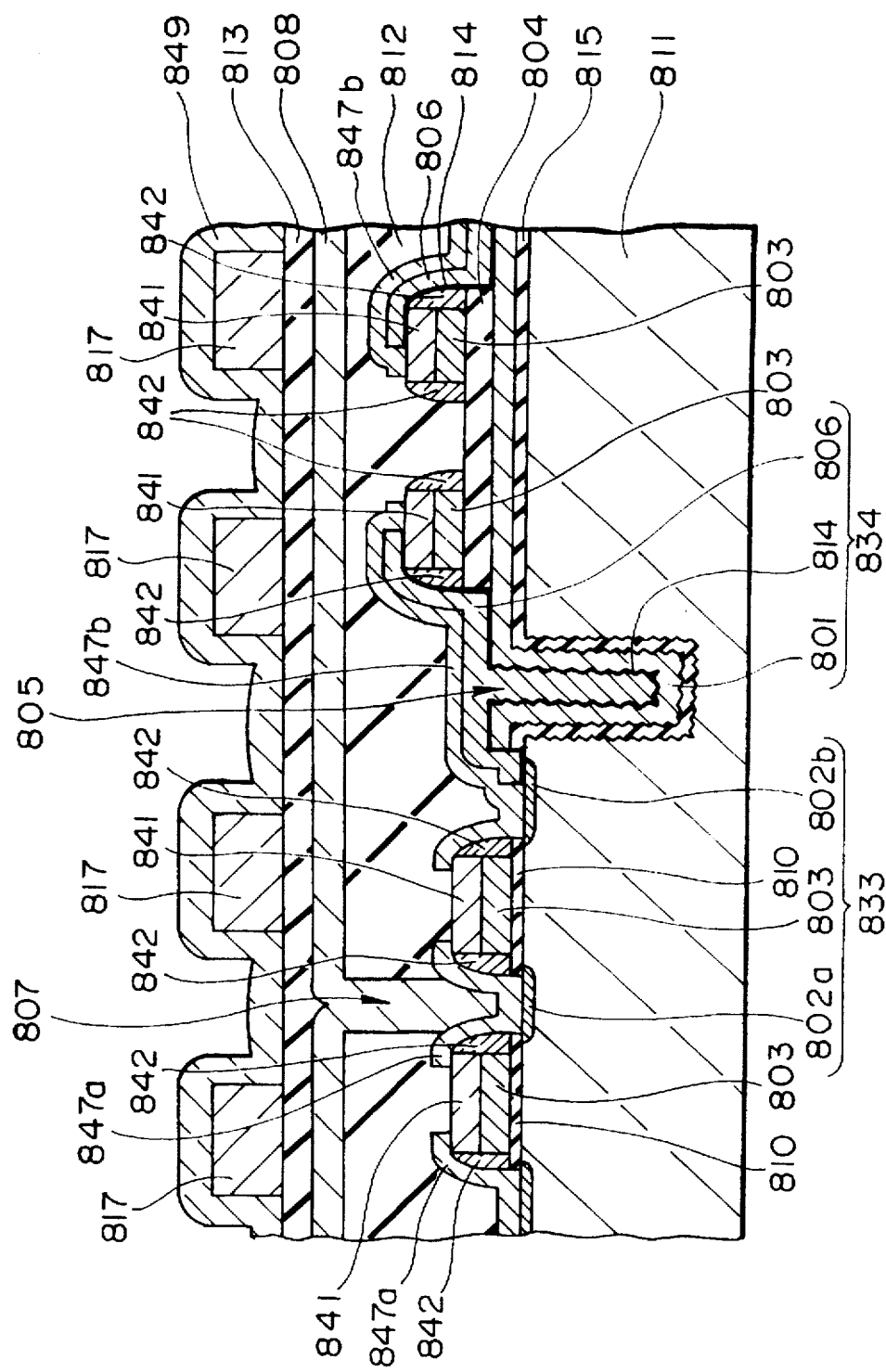
FIG. 17 is a schematic cross sectional view of a reverse trench capacitor type DRAM according to a fifth embodiment of the invention.

A reverse trench capacitor type DRAM of a semiconductor storage device according to the fifth embodiment of the invention shown in FIG. 17 is different from the third embodiment shown in FIG. 12 in that a storage electrode 806 made of a polysilicon film is formed between a capacitor insulating film 814 and a pad electrode 847b to prevent deterioration of the capacitor insulating film 814 during the manufacturing processes.

Next, a method of manufacturing a semiconductor storage device according to the fifth embodiment of the invention will be described with reference to FIGS. 18A to 18C, by taking as an example a method of manufacturing the reverse trench capacitor type DRAM shown in FIG. 17.

First, formed by the processes similar to those illustrated in FIGS. 13A to 13D are a trench 805 in a silicon substrate 811 at an element separation region 911, a pad oxide film 815, a cell plate electrode 801, a silicon oxide film 804, a gate oxide film 810, a gate electrode 803, a cap nitride film 841, and a side wall nitride film 842.

Figure 18A:
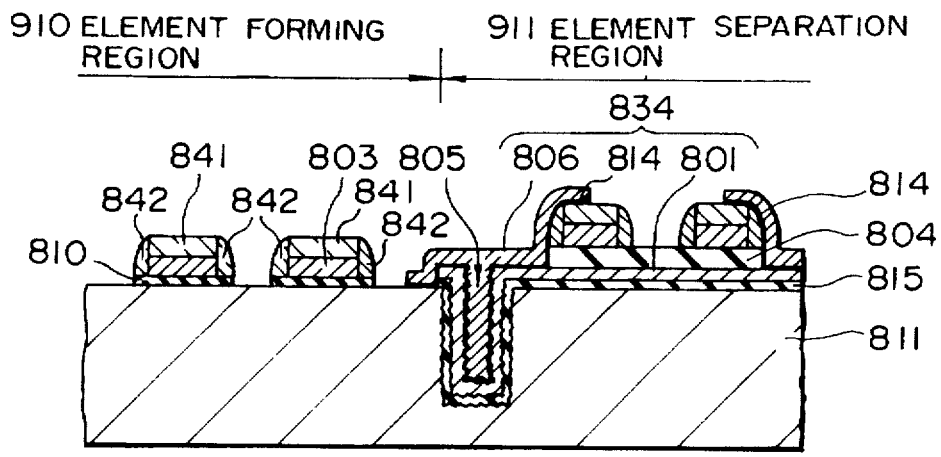
FIGS. 18A to 18C are schematic cross sectional views illustrating a method of manufacturing the reverse trench capacitor type DRAM shown in FIG. 17, in the order of manufacturing processes.

Next, as shown in FIG. 18A, after the photoresist 243 (refer to FIG. 13D) is removed, an ONO film and a polysilicon film are formed over the whole surface of the silicon substrate 811 including the inner wall of the trench 805. Thereafter, by using a photo-resist pattern (not shown) as a mask, the ONO film and polysilicon film are anisotropically etched and patterned to leave them only in the inside of the trench 805 and at its nearby area, to thereby form a capacitor insulating film 814 of the ONO structure and a storage electrode 806 of the polysilicon film. Specifically, the patterned polysilicon film is the storage electrode 806 of the trench capacitor 834, facing the cell plate electrode 801 in the trench 805 via the capacitor insulating film 814. In the state after patterning, the surface of the silicon substrate 811 is being exposed on opposite sides of the gate electrode 803 at the element forming region 910.

Figure 18B:
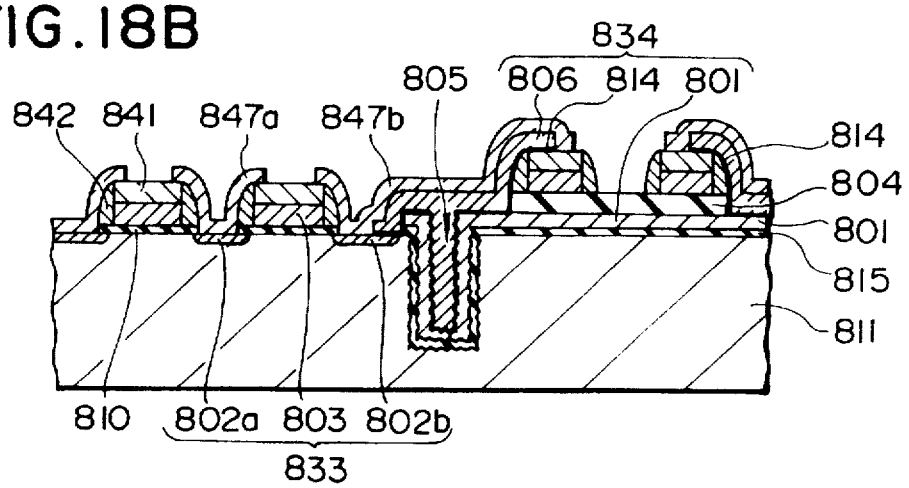

Next, as shown in FIG. 18B, a polysilicon film is formed over the whole surface of the silicon substrate 811. This polysilicon film is in contact with the surface of the silicon substrate 811 exposed on opposite sides of the gate electrode 803 and in contact with the storage electrode 806. Thereafter, phosphorous ions are implanted into the polysilicon film and anisotropically etched by using a photoresist layer (not shown) having a predetermined pattern as a mask, to thereby cut the polysilicon layer on the cap nitride film 841 of each memory cell.

As a result, the polysilicon film becomes patterned pad electrodes 847a and 847b. The pad electrode 847b is electrically connected to the storage electrode 806. Thermal diffusion of phosphorous ions into the pad electrodes 847a and 847b forms a pair of impurity doped regions 802a and 802b near in the surface of the silicon substrate 811 on opposite sides of the gate electrode 803. With the above processes, a MOS transistor 833 is formed having the gate electrode 803 on the gate oxide film 810 and the impurity doped regions 802a and 802b as the source and drain.

Figure 18C:
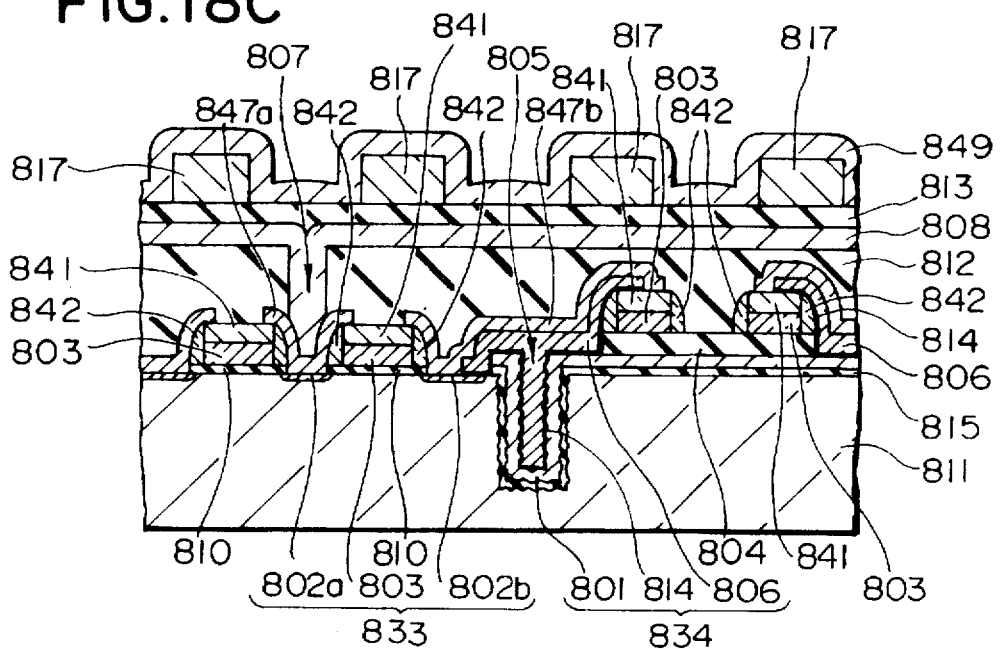

Next, as shown in FIG. 18C, a BPSG film 812 is deposited over the whole surface of the silicon substrate 811 through atmospheric pressure CVD and reflowed to planarize its surface by a thermal treatment at a temperature of 850° to 900° C. After a contact hole 807 reaching the pad electrode 847a is formed in the BPSG film 812, a polycide bit line 808, connected to the pad electrode 847a, is formed and patterned through sputtering and photolithography. Thereafter, a BPSG film 813 is formed, a wiring layer 817 is formed and patterned, and then a passivation film 849 is formed.

In this embodiment, as described with FIG. 14A of the third embodiment, the capacitor insulating film 814 made of the ONO film is not in contact with photo-resist so that the capacitor insulating film 814 is not deteriorated and leakage current of the trench capacitor 834 can be suppressed, making a highly reliable DRAM.

(6th Embodiment)

Although the trench 2 is formed in the semiconductor substrate 1 in the first embodiment shown in FIG. 2, it may be formed at a desired area of an interlayer insulating film (not shown) formed on the semiconductor substrate 1 (inclusive of the whole areas of the element separation regions 31 and 32). In this case, The bottom surface of the trench 2, formed in the area inclusive of the element separation regions 31, 32 is made flush with the surface of the semiconductor substrate 1. The shield gate insulating film 3 is formed on the whole area of the bottom surface of the trench 2 and thereafter the shield gate/cell plate electrode 4 is formed covering the whole area of the shield gate insulating film 3 and the inner wall of the trench 2.

Thereafter, the capacitor insulating film 5 is formed on the shield gate/cell plate electrode 4 and the storage electrode 6 is formed on the capacitor insulating film 5. The shield gate/cell plate electrode 4 at the trench bottom surface facing the semiconductor substrate 1 via the shield gate insulating film 3 causes the element separation regions 31 and 32 to electrically separate adjacent element forming regions 30 formed in the surface of the semiconductor substrate 1. The storage electrode 6 is electrically connected to one of the source and drain of a transistor formed in the element forming region.

Next, a method of manufacturing a semiconductor storage device according to the sixth embodiment of the invention will be described with reference to FIGS. 19A to 22B, by taking as an example a method of manufacturing the reverse trench capacitor type DRAM.

Figure 19A:
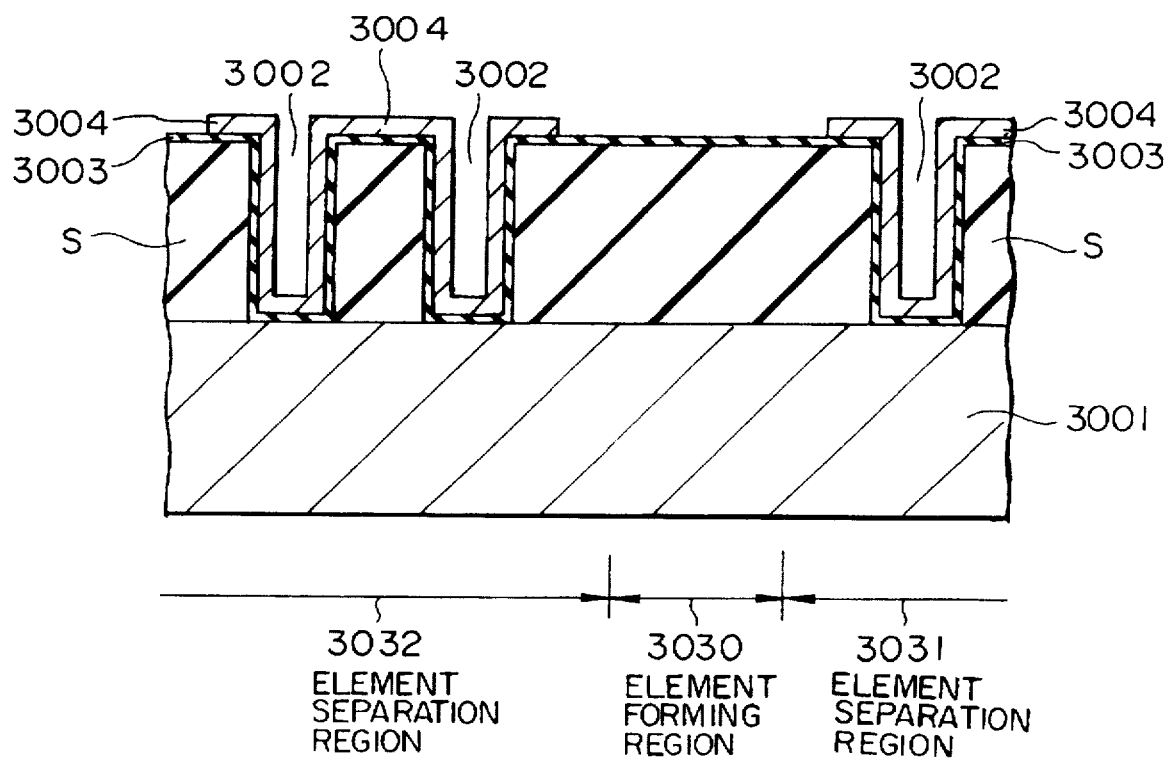
FIGS. 19A to 22B are schematic cross sectional views illustrating a method of manufacturing a reverse trench capacitor type DRAM according to a six embodiment, in the order of manufacturing processes.

First, as shown in FIG. 19A, an interlayer insulating film S made of an oxide film or the like and having a thickness of 4 μm formed on a p-type silicon substrate 3001 having a substrate surface impurity concentration of $10^{16}$ cm$^{-2}$ or higher is selectively etched by using compound containing fluorine such as $CF_4$ to form a trench 3002 having a diameter of about 0.5 μm and a depth of about 4 μm. This etching is performed until the bottom surface of the trench 3002 reaches the silicon substrate 3001. A shield gate insulating film (pad oxide film) 3003 is formed through CVD or thermal oxidation. Thereafter, a polysilicon film doped with n-type impurities such as phosphorous and arsenic is formed through CVD and the polysilicon film at the element forming region 3030 is selectively etched to form a shield gate/cell plate electrode 3004.

Figure 19B:
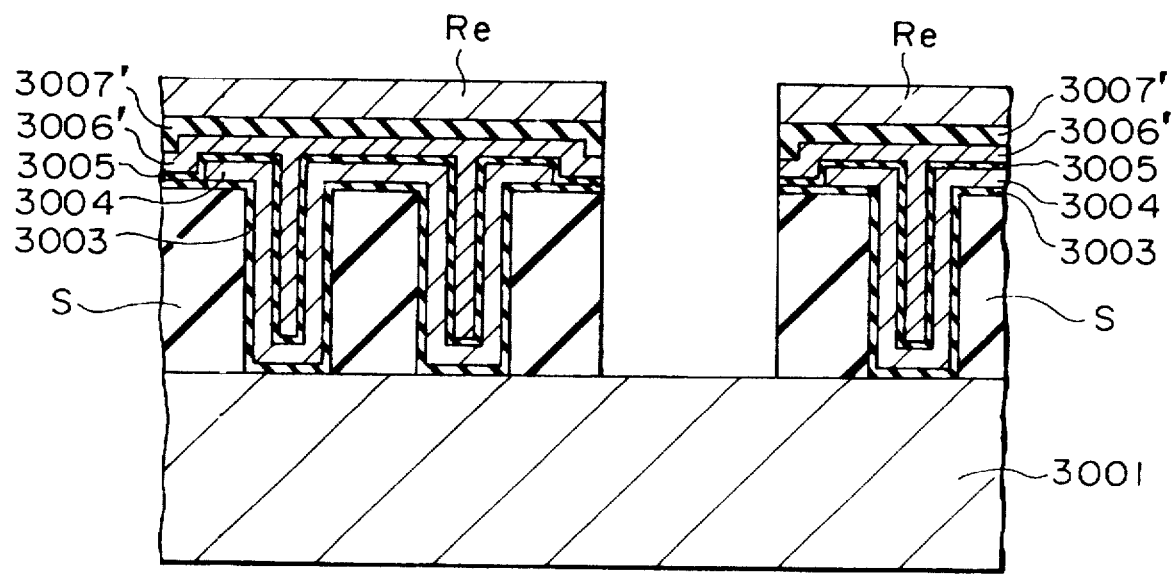

Next, as shown in FIG. 19B, a silicon nitride film is deposited through CVD on the shield gate/cell plate electrode 3004 and subjected to a heat treatment for about 15 to 30 minutes at a temperature of 850° to 900° C. under a steam or water vapor atmosphere to thereby form a capacitor insulating film 3005 of the ONO structure. Thereafter, a polysilicon film 6', doped with n-type impurities such as phosphorous and arsenic, and a silicon oxide film 7' are sequentially deposited through CVD. Thereafter, a resist film Re is deposited only at the element separation regions 3031 and 3032. Sequentially etched thereafter until the semiconductor substrate 3001 is exposed, are the silicon oxide film 3007', polysilicon film 3006', capacitor insulting film 3005, shield gate insulating film 3003, and interlayer insulating film S, by using the resist film Re as a mask.

Figure 20A:
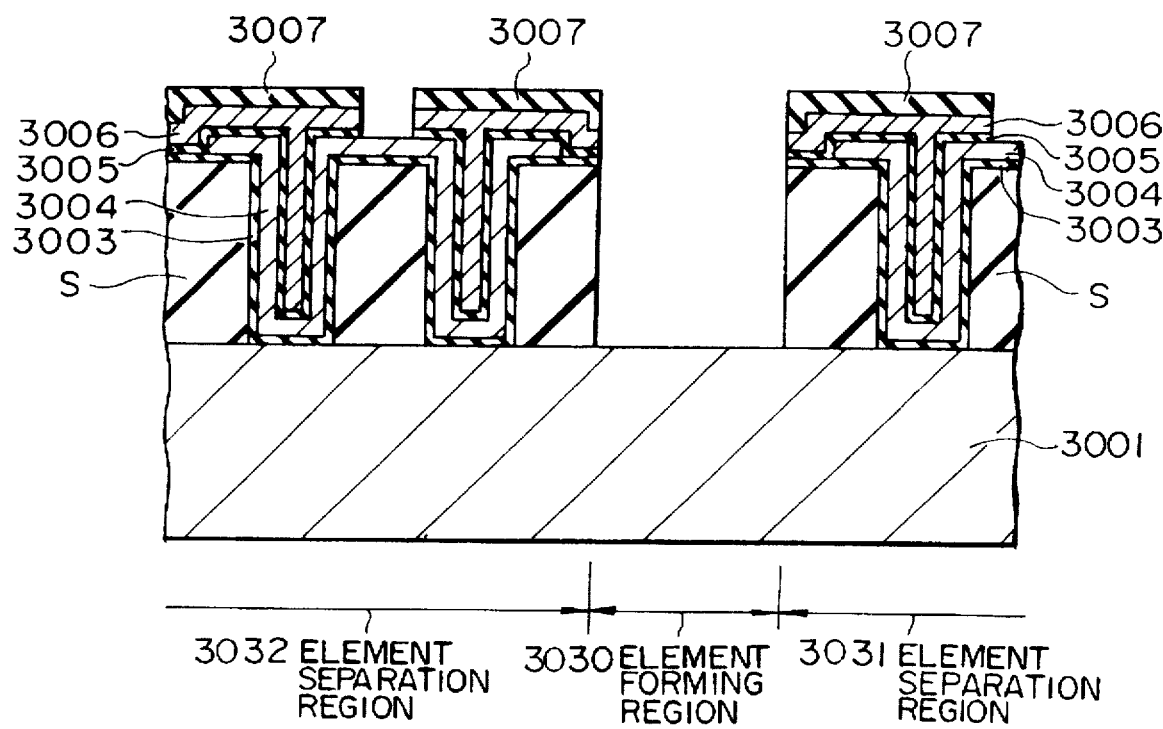

Next, as shown in FIG. 20A, after the resist film Re is removed, the silicon oxide film 3007', polysilicon film 3006', capacitor insulating film 3005, and shield gate insulating film 3003 at the element forming regions 3030 are selectively removed, and the silicon oxide film 3007', polysilicon film 3006', and capacitor insulating film 3005 at the element separation regions 3031 and 3032 are selectively removed to thereby separate the polysilicon film 3006' of each memory cell and form a storage electrode 3006 and a first cap oxide film 3007 having the patterns shown in FIG. 1.

Figure 20B:
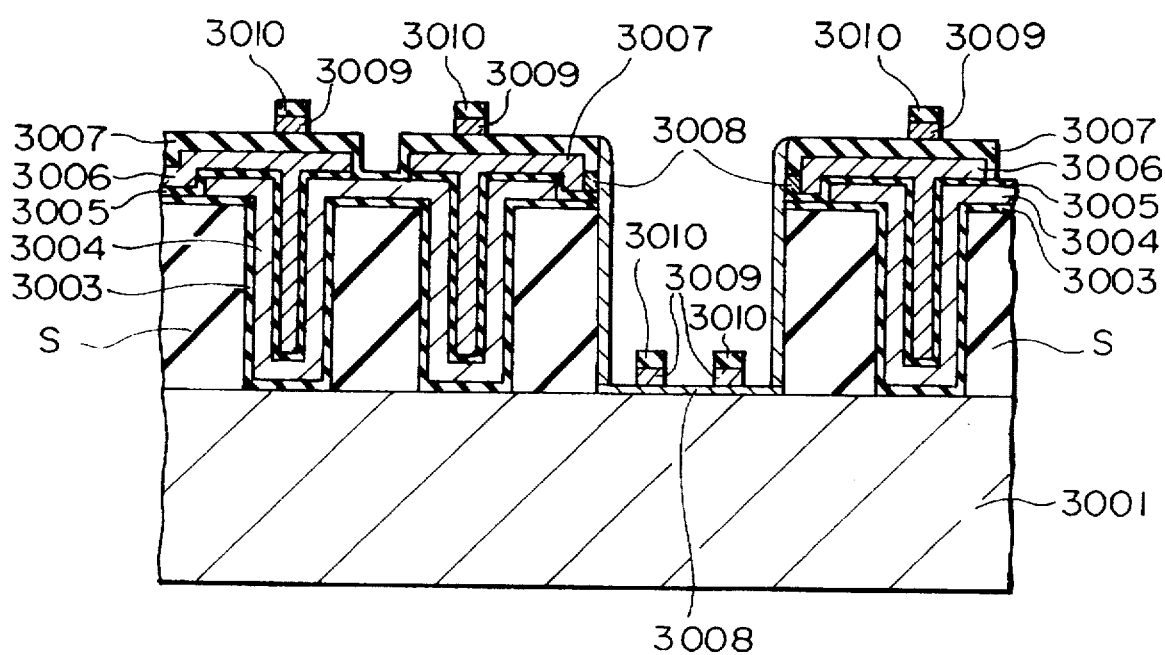

Next, as shown in FIG. 20B, a gate oxide film 3008 is formed at the element forming region 3030 by a heat treatment for about 15 to 30 minutes at a temperature of 700° to 800° C. under a steam atmosphere. Thereafter, a polysilicon film doped with n-type impurities and a silicon oxide film are deposited through CVD and patterned to form a gate electrode 3009 as the word line and a second cap oxide film 3010. In this case, when this gate oxide film 3008 is formed, the storage electrode 3006 on the side wall of a groove at the element forming region 3030 is oxidized.

Figure 21A:
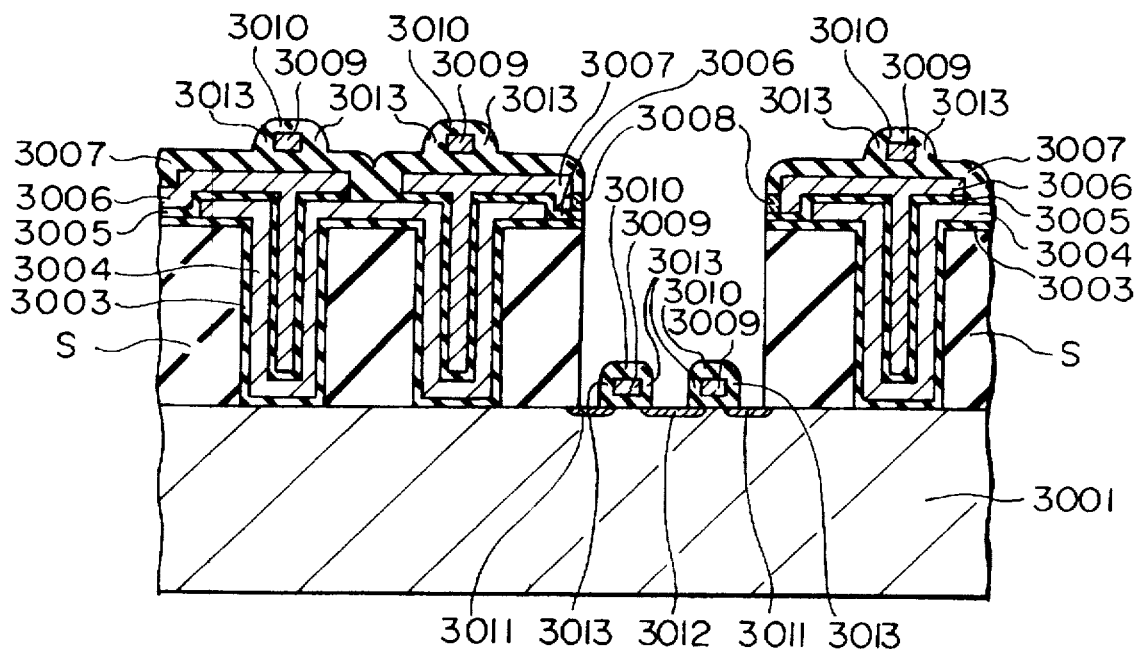

Next, as shown in FIG. 21A, by using the shield gate/cell plate electrodes 3004, storage electrodes 3006, and gate electrodes 3009 as a mask, n-type impurity ions are implanted in a self-alignment manner to form low impurity concentration doped regions 3011 and 3012 as the LDD regions of the access transistor. If phosphorous is used as the n-type impurity, ion implantation is performed at an energy of 50 to 70 keV and a dose of 1 to $3 \times 10^{13}$ cm$^{-2}$. Thereafter, a silicon oxide film is deposited by CVD and etched back to form a side wall insulating film 3013 at the side wall of the gate electrode 3009. When the side wall insulating film 3013 is formed at the side wall of the gate electrode 3009, the side wall insulating film is also formed at the side walls of the shield gate/cell plate electrode 3004 and storage electrode 3006.

Figure 21B:
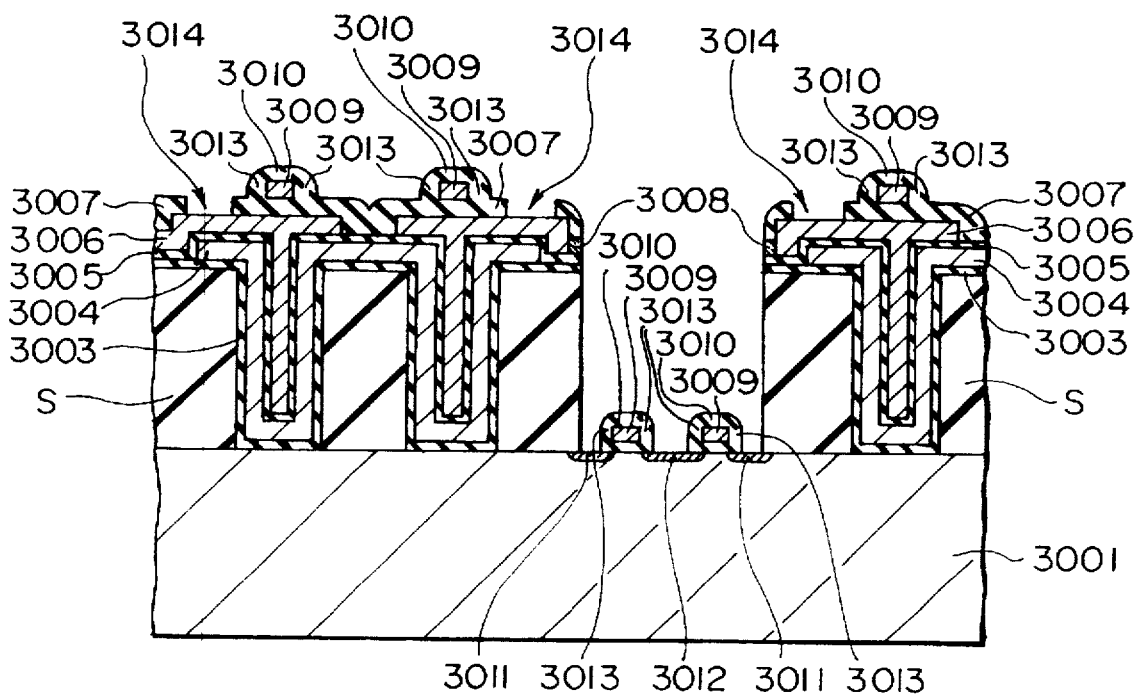

Next, as shown in FIG. 21B, the first cap oxide film 3007 on the storage electrode 3006 is selectively removed through photolithography and etching.

Figure 22A:
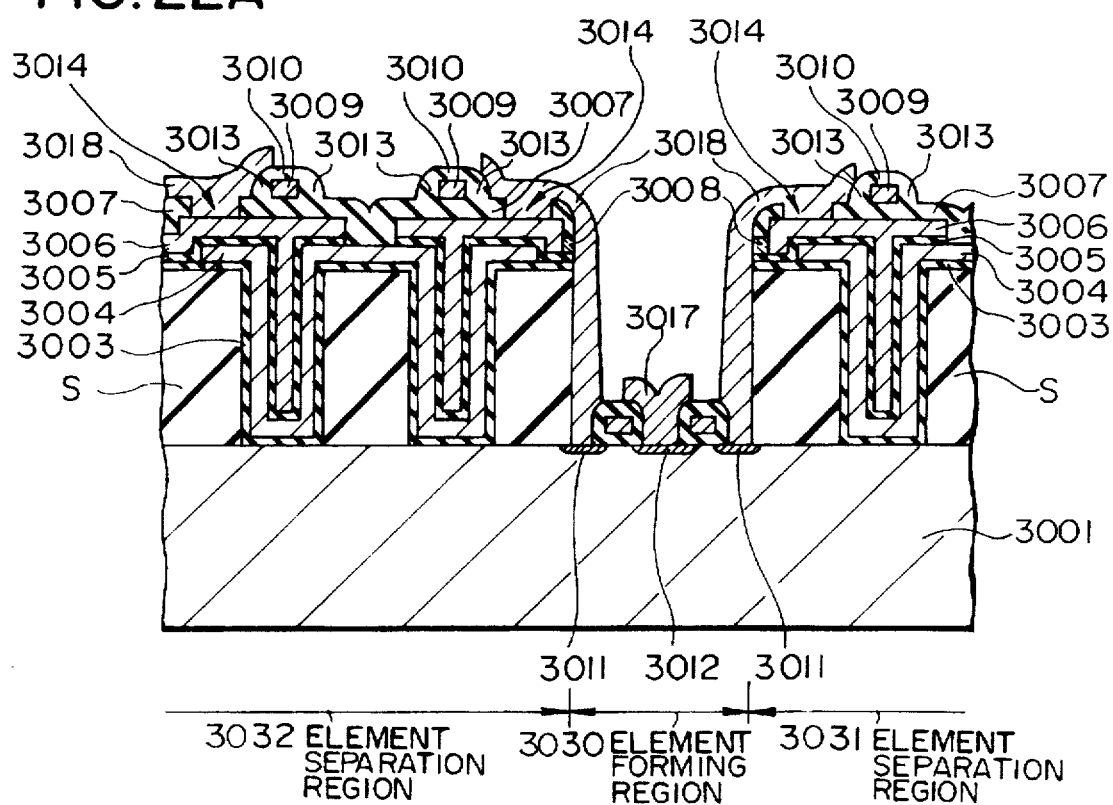

Next, as shown in FIG. 22A, a polysilicon film is deposited by CVD and patterned to form a second pad polysilicon film 3017 and a first pad polysilicon film 3018. The second pad polysilicon film 3017 covers the p-type silicon substrate 3001 at the low impurity concentration doped region 3012, and the first pad polysilicon film 3018 covers the p-type silicon substrate 3001 at the low impurity concentration doped region 3011, extends in the direction parallel to a bit line 3021, and is connected via a storage contact hole 3014 to the storage electrode 3006. Under the conditions of an energy of 80 to 90 keV and a dose of 1 to $3 \times 10^{16}$ cm$^{-2}$, n-type impurity ions of arsenic are implanted into the second pad polysilicon film 3017 and first pad polysilicon film 3018. This ion implantation may be performed before the polysilicon layer is patterned.

Figure 22B:
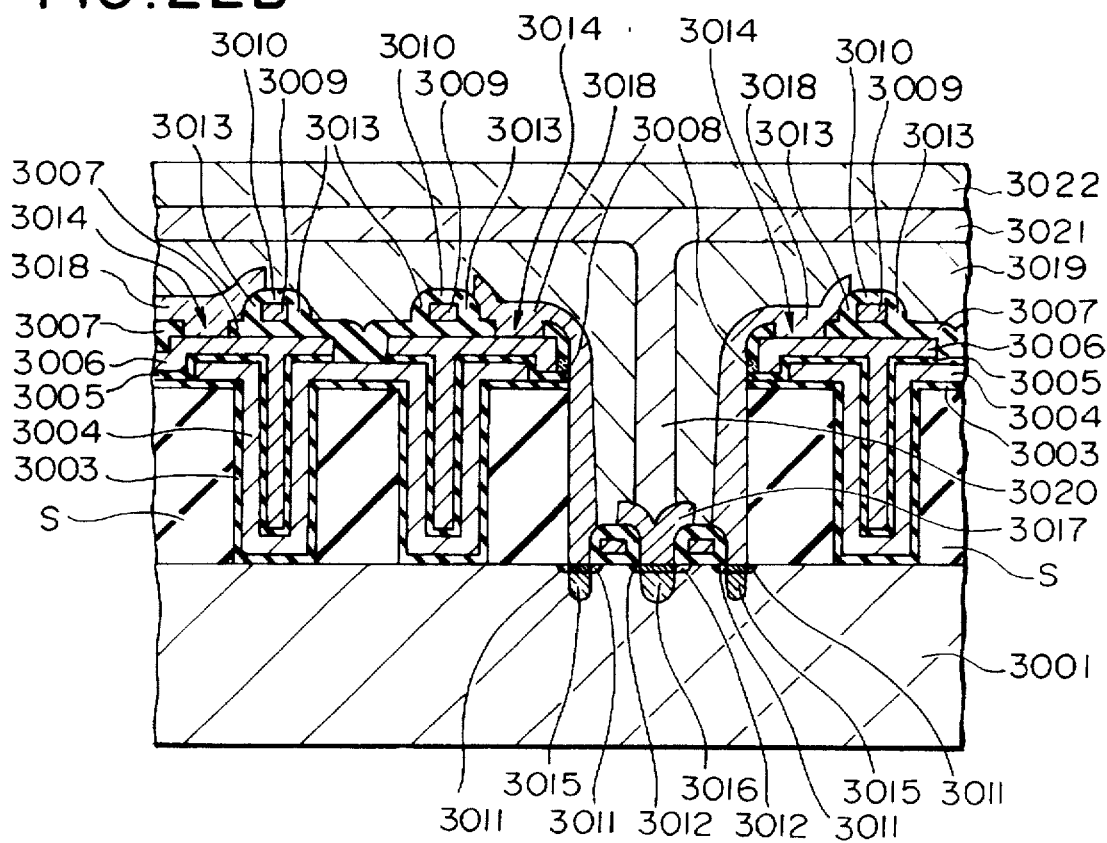

Next, as shown in FIG. 22B, a silicon oxide film containing boron and phosphorous is deposited through CVD to form a first interlayer insulating film 3019 (hereinafter called a BPSG film 3019). Thereafter, the BPSG film 3019 is reflowed to planarize its surface by a heat treatment at a temperature of 850° to 900° C., and, at the same time, n-type impurities in the second and first pad polysilicon films 3017 and 3018 are diffused into the p-type silicon substrate 3001 to form the high impurity concentration doped regions 3015 and 3016 as the source/drain. The BPSG film 3019 on the second pad polysilicon film 3017 is selectively removed through photolithography and etching to form a bit contact hole 3020. Thereafter, an aluminum film is deposited through sputtering, and patterned through photolithography and etching to form the bit line 3021 connected via the bit contact hole 3020 to the second pad polysilicon film 3017. Thereafter, an interlayer insulating film 3022 is formed over the semiconductor substrate 3001 inclusive of the bit line 3021.

As described so far, according to the present invention, the shield electrode (the shield gate electrode) of the field shield element separation structure is used also as the cell plate electrode. Accordingly, high integration of a semiconductor storage device and high capacitance of a trench capacitor are realized.

Further, since an impurity doped region of an access transistor can be formed in a self-alignment manner by diffusing impurity ions contained in the pad conductive film formed over the impurity doped layer. It is therefore possible to form a shallow impurity doped region while reducing damages to the semiconductor substrate when impurities are implanted.

Still further, since a trench is formed in the semiconductor substrate at the element separation region, and the storage electrode and the first conductive film, serving both the shield gate electrode and the cell plate electrode, are buried in the trench, it is possible to have a good element separation characteristic between trenches and easily control the capacitance of a memory cell without increasing the height of the memory cell.

Furthermore, since a single conductive layer is used both as the shield gate electrode and the cell plate electrode, it is possible to dispense with the process of forming the cell plate electrode on the storage electrode. It is also possible to reduce an aspect ratio of a bit contact hole, thereby improving the reliability of the wiring forming process.

According to the semiconductor storage device of this invention, the cell plate electrode of the capacitor of the reverse trench type cell structure is formed independently from the silicon substrate so that the potential of the cell plate electrode can be controlled independently from the silicon substrate on which a MOS transistor is formed. Therefore, by setting the potential of the cell plate electrode to (½) Vcc, for example, an electric field intensity applied to the capacitor insulating film can be made small. Accordingly, the lifetime of the capacitor insulating film can be prolonged and leakage current can be suppressed. In addition, if the capacitor insulating film is made thinner, the cell capacitance can be increased and the memory cell size is made fine, while retaining the feature of the reverse trench type cell structure that the capacitor electrode can be made broad and trenches can be disposed relatively near each other.

Further, the field shield element separation structure is adopted, and the cell plate electrode is formed contiguously with the shield plate electrode of the field shield element separation structure. Accordingly, an additional process of forming the cell plate electrode is not necessary and therefore costs required for the manufacturing processes can be reduced.

According to the semiconductor storage device manufacturing method of this invention, one of the impurity doped regions of a MOS transistor is formed by diffusing impurity ions contained in the side wall conductive film formed on the side wall of the second conductive film serving as the storage electrode of the capacitor. Accordingly, the storage electrode and impurity doped region can be electrically connected in a self-alignment manner. A particular design margin for a storage contact hole is not necessary so that the memory cell area can be made small and high integration is possible.

In the above description, although the trench formed in the semiconductor substrate at the element separation region is cylindrical, other shapes may be used as desired.

What is claimed is:

1. A semiconductor storage device comprising:
   a semiconductor substrate having two element forming regions and one element separation region disposed between said two element forming regions;
   a shield electrode formed above said semiconductor substrate so as to surround said two element forming regions for electrically separating said two element forming regions; and
   a trench capacitor formed in said semiconductor substrate at said element separation region, said trench capacitor having a trench, a first conductive layer formed covering at least an inner wall of said trench, a dielectric layer formed at least on said first conductive layer in said trench, and a second conductive layer formed at least on said dielectric layer in said trench,
   wherein said shield electrode and said first conductive layer are made of the same single layer; and
   said first conductive layer is formed covering at least the inner walls of said trench via an insulating layer.

2. A semiconductor storage device according to claim 1, further comprising:
   a transistor having a pair of impurity doped regions and formed in said semiconductor substrate at said element forming region,
   wherein said second conductive layer of said trench capacitor is electrically connected to one of said pair of impurity doped regions of said transistor.

3. A semiconductor storage device according to claim 2, comprising:
   a semiconductor substrate of a first conductivity type having two element forming regions and one element separation region disposed between said two element forming regions;
   an access transistor formed in said semiconductor substrate at said element forming region and having a pair of impurity doped regions of a second conductivity type;
   a trench formed in said semiconductor substrate at said element separation region; and
   a trench capacitor formed along an inner wall of said trench,
   wherein said trench capacitor comprises:
   a first insulating film formed covering at least the inner wall of said trench:
      a first conductive film formed at least on said first insulating film in said trench;
      a second insulating film formed at least on said first conductive film in said trench; and
      a second conductive film formed at least facing said first conductive film via said second insulating film in said trench, and
   wherein one of said pair of impurity doped regions of said access transistor is electrically connected to said second conductive film.

4. A semiconductor storage device according to claim 3, further comprising:
   a pad conductive film for electrically connecting said second conductive film to said one of said pair of impurity doped regions of said access transistor.

5. A semiconductor storage device according to claim 3, further comprising:
   a high impurity concentration doped region of the second conductivity type formed at least along the inner wall of said trench in said semiconductor substrate of the first conductivity type, said high impurity concentration doped region being electrically connected to said one of said pair of impurity doped regions of said access transistor.

6. A semiconductor storage device according to claim 4, further comprising:
   a high impurity concentration doped region of the second conductivity type formed at least along the inner wall of said trench in said semiconductor substrate of the first conductivity type, said high impurity concentration doped region being electrically connected to said one of said pair of impurity doped regions of said access transistor.

7. A semiconductor storage device according to claim 3, wherein:
   said second insulating film is of a threelayer structure having a first silicon oxide film, a silicon nitride film, and a second silicon oxide film.

8. A semiconductor storage device according to claim 4, wherein:

said second insulating film is of a threelayer structure having a first silicon oxide film, a silicon nitride film, and a second silicon oxide film.

9. A semiconductor storage device according to claim 3, wherein:
said semiconductor substrate of the first conductivity type is a p-type silicon substrate;
said impurity doped region of the second conductivity type is an n-type impurity doped region; and
said first conductive film is fixed to a potential half of a power source voltage for driving the semiconductor storage device.

10. A semiconductor storage device according to claim 4, wherein:
said semiconductor substrate of the first conductivity type is a p-type silicon substrate;
said impurity doped region of the second conductivity type is an n-type impurity doped region; and
said first conductive film is fixed to a potential half of a power source voltage for driving the semiconductor storage device.

11. A semiconductor storage device according to claim 3, wherein:
a surface of said first conductive film on the side facing said second conductivity film is rugged in said trench.

12. A semiconductor storage device according to claim 11, wherein:
the inner wall of said trench is rugged.

13. A semiconductor storage device according to claim 4, wherein:
a surface of said first conductive film on the side facing said second conductivity film is rugged in said trench.

14. A semiconductor storage device according to claim 13, wherein:
the inner wall of said trench is rugged.

15. A semiconductor storage device according to claim 3, further comprising:
a side wall conductive film formed on a side wall of said second conductive film, said side wall conductive film being made of polysilicon of the second conductivity type and electrically connecting said second conductive film to said one of said pair of impurity doped regions of said access transistor.

16. A semiconductor storage device according to claim 15, further comprising:
a high impurity concentration doped region of the second conductivity type formed at least along the inner wall of said trench in said semiconductor substrate of the first conductivity type, said high impurity concentration doped region being electrically connected to said one of said pair of impurity doped regions of said access transistor.

17. A semiconductor storage device according to claim 15, wherein:
said second insulating film is of a threelayer structure having a first silicon oxide film, a silicon nitride film, and a second silicon oxide film.

18. A semiconductor storage device according to claim 15, wherein:
said semiconductor substrate of the first conductivity type is a p-type silicon substrate;
said impurity doped region of the second conductivity type is an n-type impurity doped region; and
said first conductive film is fixed to a potential half of a power source voltage for driving the semiconductor storage device.

19. A semiconductor storage device according to claim 15, wherein:
a surface of said first conductive film on the side facing said second conductivity film is rugged in said trench.

20. A semiconductor storage device according to claim 19, wherein:
the inner wall of said trench is rugged.

21. A semiconductor storage device according to claim 1, wherein said first conductive layer is fixed to a constant potential and is independent of a substrate potential.

22. A semiconductor storage device having a trench structure comprising:
a first conductive film formed above a semiconductor substrate and including a first region and a second region, said first region being set to a potential for electrically separating adjacent active regions formed above a surface of said semiconductor substrate, and said second region being electrically connected to said first region and covering at least an inner wall of a trench, said first and second regions being formed above said semiconductor substrate as the same single layer;
a first dielectric film formed on said first conductive film; and
a second conductive film formed on said first dielectric film, said second conductive film facing said first conductive film via said first dielectric film;
wherein said first region of said first conductive film is formed so as to surround said adjacent regions; and
said second region of said first conductive film is formed on a second dielectric film formed on the inner wall of said trench.

23. A semiconductor storage device according to claim 22, wherein said second conductive film is electrically connected to one of a source and a drain of at least one transistor formed at said active region.

24. A semiconductor storage device according to claim 22, wherein said trench is formed in said semiconductor substrate, and the semiconductor storage device further comprises a third conductive film on the whole inner wall of said trench, said third conductive film being made of an impurity doped region.

25. A semiconductor storage device according to claim 24, wherein said third conductive film is electrically connected to one of a source and a drain of at least one transistor formed in said active region.

26. A semiconductor storage device according to claim 24, wherein said third conductive film is formed facing said first conductive film via said second dielectric film.

27. A semiconductor storage device according to claim 22, wherein said first dielectric film is a dielectric film including an oxide film.

28. A semiconductor storage device according to claim 22, wherein said second dielectric film is a dielectric film including an oxide film.

29. A semiconductor storage device according to claim 22, wherein said first dielectric film is a dielectric film including an oxide film and a nitride film.

30. A semiconductor storage device according to claim 22, wherein said second dielectric film is a dielectric film including an oxide film and a nitride film.

31. A semiconductor storage device according to claim 22, wherein said first conductive film is formed covering the inner wall of said trench, and part of said second conductive film is formed covering the inner wall of said trench.

32. A semiconductor storage device according claim 22, wherein an inner wall surface of said trench is rugged.

33. A semiconductor storage device according to claim 22, wherein the surface of said first conductive film is rugged in said trench.

34. A semiconductor storage device according to claim 22, wherein said first region of said first conductive film is fixed to a constant potential and is independent of a substrate potential.

35. A semiconductor storage device having a trench structure, comprising:
- a first conductive film formed covering a whole inner wall of a trench formed on a semiconductor substrate;
- a first dielectric film formed on said first conductive film formed at least on the whole inner wall of said trench, at least covering the inner wall of said trench; and
- a second conductive film formed on said semiconductor substrate and including a first region and a second region, said first region being set to a potential for electrically separating adjacent active regions formed in the surface of said semiconductor substrate, and said second region being electrically connected to said first region and being formed on an insulation film covering at least said first dielectric film covering the inner wall of said trench, said first and second regions being formed over said semiconductor substrate as the same single layer,
- said second conductive film facing said first conductive film via said first dielectric film;
- wherein said first region of said second conductive film is formed so as to surround said adjacent active regions.

36. A semiconductor storage device according to claim 35, wherein said first conductive film is electrically connected to one of a source and a drain of at least one transistor formed at said active region.

37. A semiconductor storage device according to claim 35, further comprising:
- a second dielectric film formed at least on said second conductive film formed in said trench; and
- a third conductive film formed on said second dielectric film, said third conductive film being disposed facing said second conductive film via said second dielectric film.

38. A semiconductor storage device according to claim 37, wherein said third conductive film is electrically connected to one of a source and a drain of at least one transistor formed in said active region.

39. A semiconductor storage device according to claim 35, wherein said first dielectric film is a dielectric film including an oxide film.

40. A semiconductor storage device according to claim 37, wherein said second dielectric film is a dielectric film including an oxide film.

41. A semiconductor storage device according to claim 35, wherein said first dielectric film is a dielectric film including an oxide film and a nitride film.

42. A semiconductor storage device according to claim 37, wherein said second dielectric film is a dielectric film including an oxide film and a nitride film.

43. A semiconductor storage device according to claim 37, wherein said second conductive film is formed covering the inner wall of said trench, and part of said third conductive film is formed covering the whole inner wall of said trench.

44. A semiconductor storage device according claim 35, wherein an inner wall surface of said trench is rugged.

45. A semiconductor storage device according to claim 35, wherein the surface of said first conductive film is rugged in said trench.

46. A semiconductor storage device according to claim 35, wherein said second region of said second conductive film is fixed to a constant potential and is independent of a substrate potential.

47. A semiconductor storage device according to claim 35, wherein said trench is formed in said semiconductor substrate, and said first conductive film formed on the whole inner wall of said trench is an impurity doped layer.

* * * * *